(12) United States Patent
Nanataki et al.

(10) Patent No.: US 7,842,398 B2
(45) Date of Patent: Nov. 30, 2010

(54) DIELECTRIC DEVICE

(75) Inventors: Tsutomu Nanataki, Toyoake (JP);
Nobuyuki Kobayashi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 12/419,499

(22) Filed: Apr. 7, 2009

(65) Prior Publication Data

US 2009/0208774 A1 Aug. 20, 2009

Related U.S. Application Data

(62) Division of application No. 11/563,776, filed on Nov. 28, 2006, now abandoned.

(30) Foreign Application Priority Data

Mar. 23, 2006 (JP) ............................. 2006-079919

(51) Int. Cl.
*B32B 5/18* (2006.01)
*B32B 15/04* (2006.01)
(52) U.S. Cl. .................. 428/610; 428/469; 428/547; 428/310.5; 428/694 R
(58) Field of Classification Search ............... None
See application file for complete search history.

(56) References Cited

U.S. PATENT DOCUMENTS

| 5,527,605 | A | * | 6/1996 | Doessel et al. ............. 428/332 |
| 5,656,883 | A | * | 8/1997 | Christensen ............... 313/310 |
| 5,900,282 | A | | 5/1999 | Collins et al. |
| 6,614,644 | B2 | * | 9/2003 | Chazono et al. .......... 361/321.2 |
| 7,074,507 | B2 | * | 7/2006 | Maria et al. ............... 428/701 |
| 7,569,284 | B2 | * | 8/2009 | Shero et al. ............... 428/610 |
| 2006/0012279 | A1 | | 1/2006 | Nanataki et al. |
| 2007/0052339 | A1 | * | 3/2007 | Cathey ..................... 313/310 |

FOREIGN PATENT DOCUMENTS

| JP | 2002-217465 A1 | 8/2002 |
| JP | 2005-183361 A1 | 7/2005 |

* cited by examiner

*Primary Examiner*—Jennifer C McNeil
*Assistant Examiner*—Vera Katz
(74) *Attorney, Agent, or Firm*—Burr & Brown

(57) ABSTRACT

The dielectric device includes a substrate, a lower electrode, a dielectric layer, and an upper electrode. The lower electrode is bonded onto the substrate. The dielectric layer is bonded onto the lower electrode. The dielectric layer is obtained through thermal treatment of a film layer formed by spraying of a powdery dielectric material and a fine-particulate metal. In the thus-formed film layer, the metal is dispersed in the matrix of the dielectric material. Thermal treatment of the film layer causes migration of the metal in the film layer. This metal migration causes a lower-electrode-adjacent portion and upper-surface-adjacent portion of the dielectric layer to have different metal contents.

2 Claims, 11 Drawing Sheets

DIELECTRIC DEVICE

CROSS REFERENCE TO RELATED APPLICATION

This application is a division of U.S. application Ser. No. 11/563,776, filed Nov. 28, 2006, now abandoned, the entirety of which is incorporated herein by reference.

BACKGROUND OF THE INVENTION

1. Field of the Invention

The present invention relates to a dielectric device including a dielectric layer, and to a method for producing the dielectric device.

2. Description of the Related Art

A variety of dielectric devices of this type have conventionally been known. Generally, such a dielectric device includes, in addition to a dielectric layer, a predetermined substrate, a lower electrode layer, and an upper electrode. The lower electrode layer is formed on the substrate. The dielectric layer is formed on the lower electrode layer. The upper electrode is formed on the dielectric layer. The dielectric layer is formed by subjecting the lower-electrode-layer-formed substrate to film formation through, for example, the screen printing process, the green sheet process, aerosol deposition method, or powder jet deposition method.

The screen printing process is a technique in which a substrate is coated, through screen printing, with a slurry prepared by dispersing ceramic powder in a solvent containing an organic binder, and the resultant coating film is sintered at a high temperature of 900° C. or higher, to thereby form a dielectric layer. The green sheet process is a technique in which a thick film having a predetermined thickness is formed from the aforementioned slurry, followed by drying, thereby yielding a green sheet; the green sheet is subjected to a predetermined machining process such as cutting or drilling; and the resultant green sheet is sintered at a high temperature in a manner similar to that described above, to thereby form a dielectric layer. Aerosol deposition method is a technique in which an aerosol is formed by dispersing powder in a gas through, for example, vibration; the thus-formed aerosol is conveyed to a deposition chamber which has been evacuated to a predetermined level; and the aerosol is sprayed through a nozzle onto a predetermined substrate, to thereby form a dielectric layer. Powder jet deposition method is a technique in which powder is conveyed by means of high-pressure gas, and is sprayed, at high speed, through a nozzle to a substrate provided in air, to thereby form a dielectric layer.

Typical examples of the aforementioned dielectric device include a piezoelectric actuator and an electron emitter.

A piezoelectric actuator is configured such that when a predetermined electric field is applied to a dielectric layer through application of a predetermined voltage between a lower electrode layer and an upper electrode, the dielectric layer can be deformed. For example, Japanese Patent Application Laid-Open (Kokai) No. 2002-217465 discloses a unimorph-type piezoelectric actuator including a substrate and a dielectric layer bonded thereonto, the actuator being configured such that the substrate can be bent or deformed through expansion and contraction of the dielectric layer through the transverse piezoelectric effect.

Meanwhile, an electron emitter is configured such that it can be suitably employed as an electron beam source in a variety of apparatuses that utilize electron beams, including a display (e.g., a field emission display (FED)), an electron beam irradiation apparatus, a light source, an electronic-component-manufacturing apparatus, and an electronic circuit component.

Such an electron emitter (i.e., a type of the aforementioned dielectric device) includes an emitter section which is provided in a reduced-pressure atmosphere having a predetermined vacuum level. The emitter section, which includes a dielectric layer, is configured such that it can emit electrons into the reduced-pressure atmosphere through application of a predetermined driving electric field between a lower electrode layer and an upper electrode. Conventionally known electron emitters of this type include those disclosed in Japanese Patent Application Laid-Open (Kokai) No. 2005-183361 and the specification of U.S. Patent Application Publication No. 2006/0012279.

Such an electron emitter (i.e., a type of the aforementioned dielectric device) is operated as follows. Firstly, in the first stage, voltage is applied between an upper electrode and a lower electrode layer so that the upper electrode is higher in electric potential. An electric field generated by the applied voltage brings the emitter section of the electron emitter into a predetermined polarization state.

Subsequently, in the second stage, voltage is applied between the upper electrode and the lower electrode layer so that the upper electrode is lower in electric potential. Through this voltage application, the polarization of the emitter section is inverted, and electrons are accumulated on an electron emission region.

Subsequently, in the third stage, voltage is again applied so that the upper electrode is higher in electric potential. Through this voltage application, the polarization of the emitter section is re-inverted. With this polarization inversion, the electrons accumulated on the electron emission region are emitted from the emitter section by means of electrostatic repulsion between the electrons and dipoles, and the thus-emitted electrons fly in the aforementioned reduced-pressure atmosphere.

SUMMARY OF THE INVENTION

The present invention provides a dielectric device exhibiting higher performance as compared with a conventional dielectric device. For example, when the dielectric device of the present invention is in the form of a piezoelectric actuator, the piezoelectric actuator provides an increased amount of deformation through application of a predetermined voltage. Alternatively, when the dielectric device of the present invention is in the form of an electron emitter, the electron emitter provides an increased quantity of electrons to be emitted through application of a predetermined voltage, and exhibits enhanced electron emission efficiency.

In one aspect of the present invention, the dielectric device includes a dielectric layer. The dielectric layer may be formed on a predetermined substrate. The dielectric layer may be bonded directly onto the substrate, or may be bonded, via a predetermined base electrode layer, to the substrate.

A characteristic feature of the dielectric device resides in that the dielectric layer is formed by spraying a powdery dielectric material and a fine-particulate metal toward the substrate to thereby yield a layer which is to become the dielectric layer (hereinafter the layer to become the dielectric layer may be referred to a "film layer"), and by thermally treating the film layer for causing migration of the metal in the film layer so that the metal content by volume of the dielectric layer is 10% or less, and the porosity of the dielectric layer falls within a range of 2% to 20%.

With this configuration, the film layer has a dense structure in which the fine-particulate metal is dispersed in the matrix of the dielectric material, and exhibits high dielectric constant. As used herein, the expression "the fine-particulate metal is dispersed in the matrix of the dielectric material" refers to the state where finely divided particles of the metal are present discretely in the matrix. The fine metal particles are not necessarily dispersed uniformly in the film layer. For example, the fine metal particles may be non-uniformly dispersed with respect to a thickness direction of the film layer.

Thermal treatment of the thus-formed dense film layer reduces lattice defect, lattice strain, etc. in the dielectric layer, and results in progress of grain growth and improvement of properties of the layer. Migration of the metal in the film layer associated with the thermal treatment releases compressive stress in the film layer, which stress would otherwise occur during film formation. This greatly improves properties (e.g., piezoelectric property and polarization inversion property) of the dielectric layer.

Thus, the dielectric device provided by the present invention exhibits higher performance as compared with a conventional dielectric device. For example, according to the present invention, in the aforementioned piezoelectric actuator, the amount of deformation through application of a predetermined voltage can be increased. Alternatively, according to the present invention, in the aforementioned electron emitter (i.e., a type of the dielectric device), the quantity of electrons to be emitted through application of a predetermined voltage can be increased, and electron emission efficiency can be enhanced.

In contrast, when the metal content by volume of the dielectric layer exceeds 10%, the breakdown voltage of the entirety of the layer is lowered, whereas when the porosity of the layer exceeds 20%, the breakdown voltage of the layer is lowered, and properties (e.g., polarization inversion property and piezoelectric property) of the layer are impaired. Meanwhile, when the porosity of the dielectric layer is less than 2%, properties (e.g., polarization inversion property and piezoelectric property) of the layer fail to be improved.

In another aspect of the present invention, the dielectric device includes a substrate, a base electrode, and a dielectric layer. The base electrode is formed of a conductor film provided on the substrate. The dielectric layer is formed so as to contain a metal, and is provided on the base electrode.

A drive electrode may be formed on the dielectric layer. The drive electrode, which is formed of a conductor film, may be provided such that the dielectric layer is sandwiched between the drive electrode and the base electrode. That is, the drive electrode may be formed on an outer surface of the dielectric layer. The outer surface is opposite the surface of the dielectric layer which faces the base electrode. The dielectric device may be configured so that a predetermined driving electric field is applied to the dielectric layer through application of a drive voltage having a predetermined waveform between the base electrode and the drive electrode.

A characteristic feature of the dielectric device resides in that the dielectric layer is formed such that the metal content of the layer differs from portion to portion in a thickness direction of the layer. The dielectric layer can be formed by spraying a powdery dielectric material and a fine-particulate metal toward a predetermined substrate to thereby yield a film layer, and by thermally treating the film layer for causing migration of the metal in the film layer.

With this configuration, the metal contained in the dielectric layer can enhance the dielectric constant of the layer. That is, the metal contained in the dielectric layer can suppress reduction of the dielectric constant of the layer attributed to defects in the layer.

In the dielectric layer, the metal content differs from portion to portion in a thickness direction of the layer. Therefore, the aforementioned properties (e.g., piezoelectric property and polarization inversion property) of the dielectric layer can be varied in the thickness direction.

For example, the metal content of a portion of the dielectric layer in the vicinity of the outer surface of the layer (hereinafter the portion may be referred to as an "outer-surface-adjacent portion") can be regulated to be higher than that of a portion (other than the outer-surface-adjacent portion) of the dielectric layer (hereinafter the portion other than the outer-surface-adjacent portion may be referred to as an "outer-surface-distant portion"). Specifically, for example, the metal content of the outer-surface-adjacent portion can be regulated to be ¼ or less that of the outer-surface-distant portion. Alternatively, for example, the metal content of the outer-surface-adjacent portion can be regulated to be almost zero (i.e., the metal is not specified through image analysis by use of an electron micrograph, etc., or, for example, the metal content as detected by means of a predetermined analyzer is twice or less the detection limit of the analyzer).

With this configuration, the dielectric layer can be formed such that the dielectric constant of the outer-surface-distant portion is higher than that of the outer-surface-adjacent portion. In this case, when voltage is applied in the aforementioned thickness direction, electric field concentration may occur at the outer-surface-adjacent portion. Therefore, polarization inversion or a similar operation may occur at the outer-surface-adjacent portion to a more remarkable extent.

The thus-formed dielectric layer having the aforementioned configuration is more suitable for application or performance of the dielectric device. Thus, the present invention can provide a dielectric device exhibiting higher performance as compared with a conventional dielectric device.

The dielectric layer may be formed such that the metal content of a first portion; i.e., a portion located between the center of the layer in a thickness direction towards the base electrode, is higher than that of a second portion; i.e., a portion of the layer other than the first portion. In this case, preferably, the dielectric layer is formed such that the metal content by volume of the first portion is 2% to 20%, and the metal content by volume of the second portion is 5% or less.

With this configuration, the dielectric constant of the first portion, which is located near the base electrode, can become higher than that of the second portion, which is located away from the base electrode. In this case, when voltage is applied in the aforementioned thickness direction, electric field concentration occurs at the second portion. Therefore, polarization inversion, deformation through the converse piezoelectric effect, or a similar operation occurs at the second portion to a more remarkable extent.

In contrast, when the metal content of the first portion exceeds 20%, dielectric properties of the first portion are lost, whereas when the metal content of the first portion is less than 2%, properties (e.g., polarization inversion property and piezoelectric property) of the dielectric layer fail to be improved. Meanwhile, when the metal content of the second portion exceeds 5%, properties (e.g., polarization inversion property and piezoelectric property) of the dielectric layer are impaired.

The dielectric device of the present invention, which has the aforementioned configuration, can be produced through the following procedure. Firstly, a powdery dielectric material and a fine-particulate metal are sprayed toward a substrate, to thereby form a film layer in which the metal is dispersed in the matrix of the dielectric material (film layer formation step). Subsequently, the film layer formed in the film layer formation step is thermally treated for causing migration of the metal in the film layer, to thereby yield a dielectric layer (thermal treatment step). The thermal treatment step causes the dielectric layer to contain the metal in a predetermined state.

Specifically, the aforementioned film layer formation step forms, at high efficiency, the film layer having a dense structure and a high dielectric constant, in which the metal is dispersed in the matrix of the dielectric material. In the aforementioned thermal treatment step, thermal treatment of the thus-formed dense film layer, and migration of the metal in the film layer associated with the thermal treatment can suppress impairment of properties (e.g., dielectric constant) of the dielectric layer, which impairment is due to residual stress or the presence of defects, etc. in the dielectric layer. Therefore, the thus-formed dielectric layer exhibits greatly improved piezoelectric and polarization inversion properties.

As described above, according to the present invention, a dielectric device exhibiting higher performance as compared with a conventional dielectric device can be produced through a very simple production process.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF THE INVENTION

A preferred embodiment and Examples of the dielectric device of the present invention will next be described with reference to the drawings and tables. The material and structure of components of the dielectric device of the present invention will be described with reference to one typical embodiment, for the sake of readily understandable and consistent illustration. Modifications of the material and structure of the components of the dielectric device according to the embodiment will be collectively described after description of the configuration, operation, and effect of the dielectric device according to the embodiment.

Schematic Description of Dielectric Device

Figure 1:
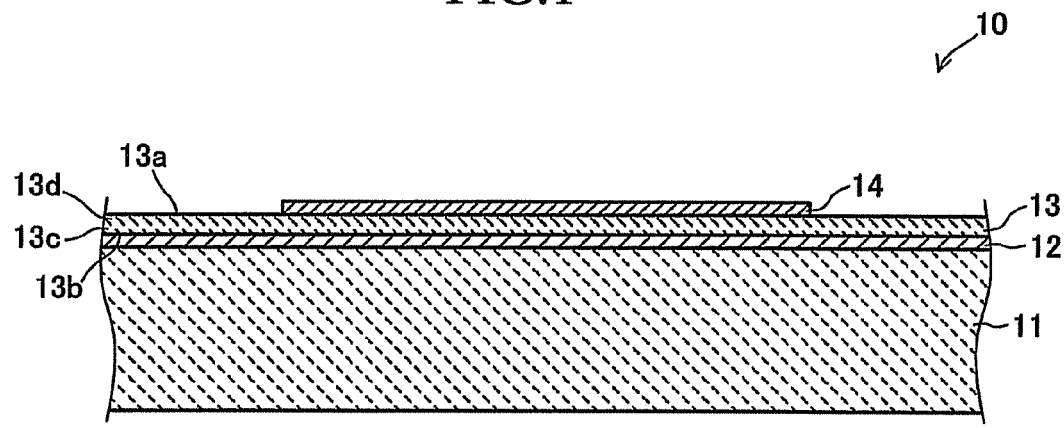
FIG. 1 is an enlarged cross-sectional view showing a dielectric device according to an embodiment of the present invention.

FIG. 1 is an enlarged cross-sectional view of a dielectric device 10 according to the present embodiment. As shown in FIG. 1, the dielectric device 10 includes a substrate 11, a lower electrode 12, a dielectric layer 13, and an upper electrode 14.

The substrate 11 is formed of a glass or ceramic plate material. The ceramic material employed for forming the substrate 11 is preferably a ceramic material containing at least one species selected from the group consisting of aluminum oxide, magnesium oxide, mullite, aluminum nitride, silicon nitride, and stabilized zirconium oxide, from the viewpoints of heat resistance, chemical stability, and insulating property. Particularly preferably, the substrate 11 is formed of stabilized zirconium oxide, from the viewpoints of high mechanical strength and excellent toughness.

As used herein, the term "stabilized zirconium oxide" refers to zirconium oxide in which crystal phase transition is suppressed through addition of a stabilizer. The stabilized zirconium oxide encompasses partially stabilized zirconium oxide. Examples of the stabilized zirconium oxide include zirconium oxide containing a stabilizer (e.g., calcium oxide, magnesium oxide, yttrium oxide, scandium oxide, ytterbium oxide, cerium oxide, or an oxide of a rare earth metal) in an amount of 1 to 30 mol %. From the viewpoint of enhancement of mechanical strength, zirconium oxide containing yttrium oxide as a stabilizer is particularly preferred. In this case, the yttrium oxide content is preferably 1.5 to 6 mol %, more preferably 2 to 4 mol %. Zirconium oxide containing, in addition to yttrium oxide, aluminum oxide in an amount of 0.1 to 5 mol % is more preferred.

The stabilized zirconium oxide may have, for example, a cubic-monoclinic crystal phase, a tetragonal-monoclinic crystal phase, or a cubic-tetragonal-monoclinic crystal phase. From the viewpoints of strength, toughness, and durability, the stabilized zirconium oxide preferably has, as a primary crystal phase, a tetragonal crystal phase or a tetragonal-cubic crystal phase.

The lower electrode 12 is formed on the substrate 11. The lower electrode 12, which is an electrode member constituting a base electrode in the present invention, is formed of a conductor film. The conductor film constituting the lower electrode 12 may be formed of, for example, a metallic material, a cermet, a carbon material, or an oxide material. These materials may be employed singly or in combination.

Examples of the metallic material which may be employed include gold, silver, platinum, iridium, palladium, rhodium, molybdenum, and tungsten. The metallic material may be any of such metallic elements or an alloy formed of such metallic elements. Examples of preferably employed alloys include silver-palladium alloy, silver-platinum alloy, and platinum-palladium alloy. Examples of preferably employed cermets include a cermet material containing platinum and a ceramic material.

Examples of the carbon material which may be employed include graphite, diamond thin film, diamond-like carbon, and carbon nanotube.

Examples of the oxide material which may be employed include ruthenium oxide, iridium oxide, strontium ruthenate, $La_{1-x}Sr_xCoO_3$ (e.g., x=0.3 or 0.5), $La_{1-x}Ca_xMnO_3$, $La_{1-x}Ca_xMn_{1-y}CO_yO_3$ (e.g., x=0.2, y=0.05), and indium tin oxide (ITO).

The dielectric layer 13 is provided such that the lower electrode 12 is sandwiched between the layer 13 and the substrate 11. The dielectric layer 13 has an upper surface 13a, which is opposite a lower surface 13b of the layer 13 facing the lower electrode 12. The upper electrode 14, which is formed of a conductor film, is formed on the upper surface 13a. The conductor film constituting the upper electrode 14 may be formed of any of the aforementioned materials, such as a metallic material, a cermet, a carbon material, or an oxide material.

The dielectric layer 13 is formed of a metal-containing dielectric material. The dielectric material which primarily constitutes the dielectric layer 13 is preferably a dielectric material having a relatively high specific dielectric constant (e.g., 1,000 or more). Examples of such a dielectric material include barium titanate, lead zirconate, lead magnesium niobate, lead nickel niobate, lead zinc niobate, lead manganese niobate, lead magnesium tantalate, lead nickel tantalate, lead antimony stannate, lead titanate, lead magnesium tungstate, and lead cobalt niobate.

The dielectric layer 13 may be formed of a ceramic material containing an arbitrary combination of such dielectric materials. The dielectric layer 13 may also be formed of a ceramic material containing, as a primary component, such a dielectric material in an amount of 50 wt. % or more. The dielectric layer 13 may also be formed of a material containing any of the aforementioned dielectric materials and ceramic materials, and further containing a compound appropriately selected from among, for example, oxides of lanthanum, calcium, strontium, molybdenum, tungsten, barium, niobium, zinc, nickel, manganese, etc. (these may be appropriately employed in combination).

The material employed for forming the dielectric layer 13 is preferably, for example, a binary dielectric material containing lead magnesium niobate (PMN) and lead titanate (PT); i.e., nPMN-mPT (n, m: ratio by mole), which has, through an increase in PMN ratio, a lowered Curie point and an increased specific dielectric constant as measured at room temperature. In the nPMN-mPT dielectric material, particularly preferably, n is 0.85 to 1.0 and m is 1.0−n. In this case, the specific dielectric constant is 3,000 or more. For example, when n is 0.91 and m is 0.09, the specific dielectric constant as measured at room temperature is 15,000, whereas when n is 0.95 and m is 0.05, the specific dielectric constant as measured at room temperature is 20,000.

Among ternary materials containing lead magnesium niobate (PMN), lead titanate (PT), and lead zirconate (PZ), a material in which the proportion by mole of PMN is high, or a material having a composition in the vicinity of the morphotropic phase boundary (MPB) between tetragonal and pseudocubic phases or between tetragonal and rhombohedral phases is preferably employed as the aforementioned dielectric material by virtue of its high specific dielectric constant. Particularly preferred is a material (PMN:PT:PZ=0.375: 0.375:0.25) having a specific dielectric constant of 5,500, or a material (PMN:PT:PZ=0.5:0.375:0.125) having a specific dielectric constant of 4,500.

Examples of the metal which may be contained in the dielectric layer 13 include silver, copper, gold, and platinum. Particularly, gold or silver, which has a low melting point and is not easily oxidized, is preferably employed. Such a metal is dispersed in the matrix of the aforementioned dielectric material. As used herein, the expression "such a metal is dispersed in the matrix of the aforementioned dielectric material" refers to the state where finely divided particles of the metal are present discretely in the matrix to such an extent that the metal particles do not impair properties of the dielectric layer 13 serving as a dielectric thin film, including piezoelectric effect, converse piezoelectric effect, and polarization inversion.

The dielectric layer 13 is formed under predetermined film formation conditions such that the layer 13 has a predetermined porosity and contains the aforementioned metal in a predetermined state. Specifically, the dielectric layer 13 is formed such that the porosity falls within a range of 2% to 20%. The dielectric layer 13 is formed such that the metal content by volume of the layer 13 is 10% or less on the basis of the entirety of the layer 13.

The dielectric layer 13 is formed such that the metal content of the layer differs from portion to portion in a thickness direction. Specifically, the dielectric layer 13 is formed such that the metal content of a portion 13c in the vicinity of the lower electrode (hereinafter such a portion may be referred to as a "lower-electrode-adjacent portion") differs from that of a portion 13d in the vicinity of the upper surface (hereinafter such a portion may be referred to as an "upper-surface-adjacent portion"). The lower-electrode-adjacent portion 13c is located between the center (in a thickness direction) of the layer 13 and towards the lower electrode 12. The upper-surface-adjacent portion 13d is located between the center (in a thickness direction) of the layer 13 and towards the upper surface 13a.

The dielectric device 10 is configured such that the device can be driven when a predetermined driving electric field is applied to the dielectric layer 13 through application of a drive voltage having a predetermined waveform between the lower electrode 12 and the upper electrode 14.

Dielectric Device Production Method

Next will be described a production method for the dielectric device 10 according to the present embodiment with appropriate reference to the aforementioned reference numerals of FIG. 1 for illustrating components of the dielectric device 10.

Figure 2:
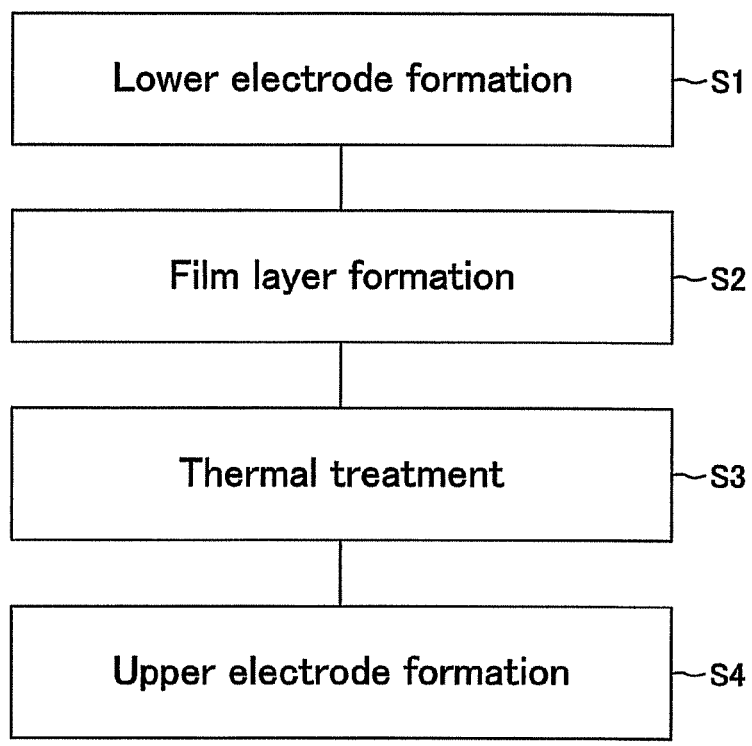
FIG. 2 is a flowchart schematically showing the production method for the dielectric device according to the embodiment.

FIG. 2 is a flowchart schematically showing the production method. As shown in FIG. 2, the production method includes a lower electrode formation step S1 ("S" is an abbreviation of "step," the same shall apply hereinafter); a film layer formation step S2; a thermal treatment step S3; and a lower electrode formation step S4.

Firstly, a lower electrode 12 is formed on a substrate 11 through the lower electrode formation step S1. The lower electrode formation step S1 may employ a generally employed film formation technique, such as a thick film formation technique (e.g., spin coating, screen printing, spraying, coating, dipping, application, or electrophoresis) or a thin film formation technique (e.g., sputtering, the ion beam process, vacuum deposition, ion plating, chemical vapor deposition (CVD), or plating).

Subsequently, a film layer containing the aforementioned dielectric material and metal is formed on the lower electrode 12 through the film layer formation step S2. In the film layer formation step S2, powder of the aforementioned dielectric material and finely divided particles of the aforementioned metal are sprayed toward the substrate 11, to thereby form a film layer in which the metal is dispersed in the matrix of the dielectric material. The film layer formation step S2 preferably employs so-called aerosol deposition method. Aerosol deposition method is a technique in which powder of the aforementioned dielectric material and finely divided particles of the aforementioned metal are dispersed in a gas through vibration or the like to form an aerosol, and subsequently the thus-formed aerosol is conveyed to a deposition chamber which has been evacuated to a predetermined level, followed by spraying of the aerosol through a nozzle onto the substrate 11, to thereby form the aforementioned film layer.

Subsequently, the film layer is thermally treated through the thermal treatment step S3. This thermal treatment causes migration of the aforementioned metal in the film layer. This metal migration forms a dielectric layer 13 containing the metal in a predetermined state.

Subsequently, an upper electrode 14 is formed on the dielectric layer 13 through the upper electrode formation step S4. The upper electrode formation step S4 can be carried out in a manner similar to that of the lower electrode formation step S1.

Figure 3:
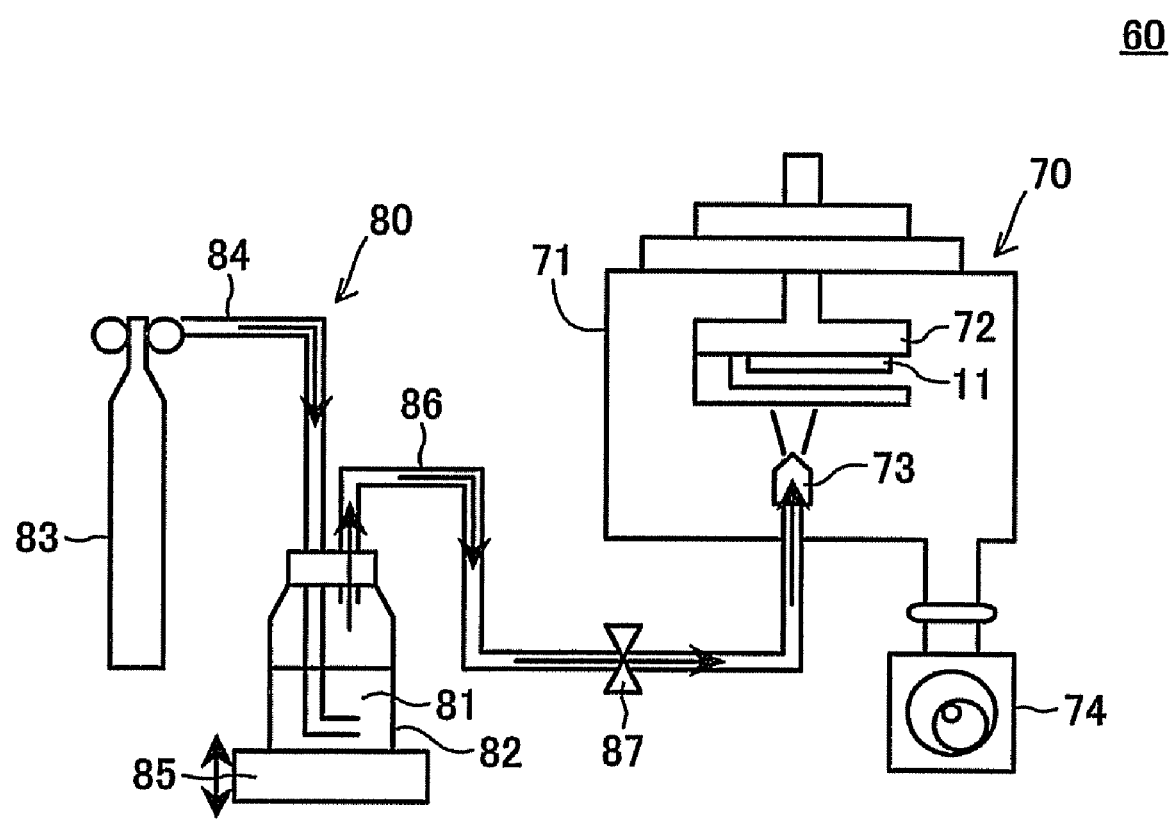
FIG. 3 schematically shows the configuration of an aerosol deposition apparatus employed in the film layer formation step shown in FIG. 2.

Specific Example Of Dielectric Layer Formation Through Aerosol Deposition Method FIG. 3 schematically shows the configuration of an aerosol deposition apparatus 60 employed in the film layer formation step S2 shown in FIG. 2. The aerosol deposition apparatus 60 includes the deposition chamber 70 and an aerosol supply unit 80.

The deposition chamber 70 includes a vacuum container 71, an XYZθ stage 72, a nozzle 73, and a vacuum pump 74. The vacuum container 71 is configured such that the vacuum of its interior can be maintained at a predetermined level. The XYZθ stage 72 is configured such that it can support the substrate 11 thereon within the vacuum container 71 and can move the substrate 11 in an arbitrary direction. The nozzle 73 is fixated in the vacuum container 71. The nozzle 73 is configured such that an aerosol can be sprayed onto the substrate 11 supported on the XYZθ stage 72. The vacuum pump 74 is configured such that it can evacuate air from the vacuum container 71 so as to maintain the vacuum of the container 71 at the aforementioned predetermined level.

The aerosol supply unit 80 is configured such that raw material powder 81 sprayed through the nozzle 73 onto the substrate 11 can be supplied to the nozzle 73. The raw material powder 81 is a mixture of the aforementioned dielectric material powder and the aforementioned fine metal particles.

The aerosol supply unit 80 includes an aerosol chamber 82, a compressed gas supply source 83, a compressed gas supply tube 84, a vibration stirring section 85, an aerosol supply tube 86, and a control valve 87.

The aerosol chamber 82 is configured as a container capable of storing the raw material powder 81. The compressed gas supply source 83 is configured such that it can store a carrier gas which is mixed with the raw material powder 81 in the aerosol chamber 82 to form an aerosol. The carrier gas to be employed may be compressed air, a rare gas (e.g., helium or argon), or an inert gas (e.g., nitrogen gas). The compressed gas supply tube 84 is configured such that the aforementioned carrier gas can be supplied from the compressed gas supply source 83 to the aerosol chamber 82. The vibration stirring section 85 is configured such that it vibrates the aerosol chamber 82 so as to enable an aerosol to be formed through mixing of the raw material powder 81 with the carrier gas in the aerosol chamber 82. The aerosol supply tube 86 is configured such that the aerosol formed in the aerosol chamber 82 can be supplied to the nozzle 73. The control valve 87 is configured such that it can control the flow rate of the aerosol passing through the aerosol supply tube 86 to thereby regulate the amount of the aerosol sprayed through the nozzle 73 onto the substrate 11.

The aerosol deposition apparatus 60 having the above-described configuration is operated as follows.

The raw material powder 81 is vigorously mixed with the aforementioned carrier gas in the aerosol chamber 82 through vibration generated by means of the vibration stirring section 85. This mixing forms an aerosol in the aerosol chamber 82. The thus-formed aerosol behaves as a fluid. Therefore, when the control valve 87 is in an open state, the aerosol can flow toward the vacuum container 71 by means of the difference in pressure between the aerosol chamber 82 and the vacuum container 71, and the aerosol can be sprayed through the nozzle 73 onto the substrate 11 at high speed. When the control valve 87 is opened, and the aerosol containing the raw material powder 81 is sprayed onto the substrate 11, the aforementioned film layer (which is to become the dielectric layer 13) is formed on the substrate 11 (accurately, on the lower electrode 12 shown in FIG. 1).

According to the above-described film layer formation step S2, in which the aforementioned dielectric material powder and fine metal particles are sprayed onto the substrate 11 through aerosol deposition, the powder and finely divided particles undergo crushing and plastic deformation, and are deposited onto the substrate. Therefore, a dense film layer is formed at room temperature.

When the aforementioned dielectric material powder and fine metal particles are simultaneously sprayed onto the substrate 11, the fine metal particles, which have ductility, serve as a bonding agent. Therefore, film formation on the substrate 11 is facilitated.

Schematic Description of FED

Figure 4:
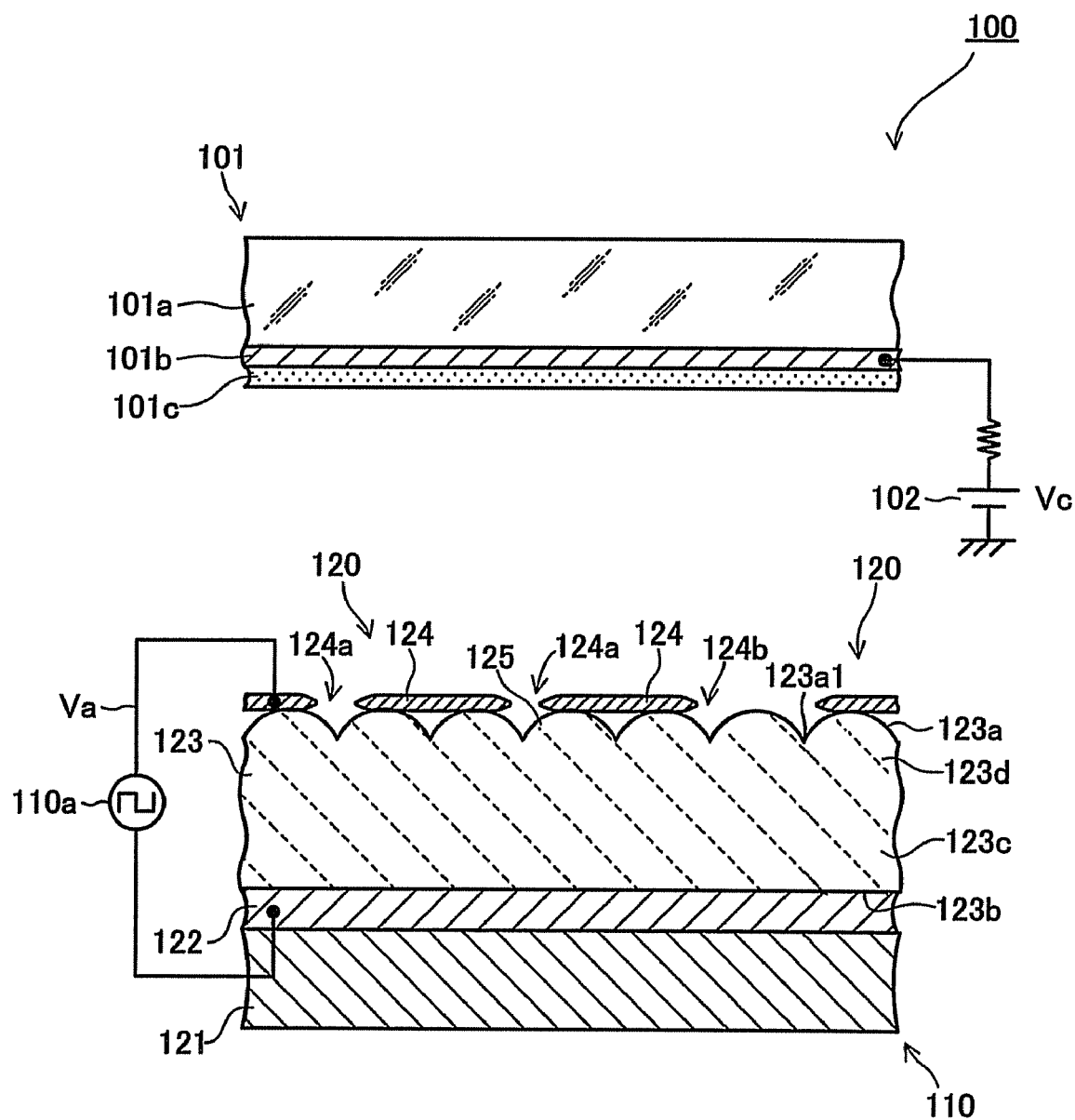
FIG. 4 is a cross-sectional view schematically showing a display to which the dielectric device according to the embodiment is applied.

FIG. 4 is a cross-sectional view schematically showing a display 100, which is an FED to which the dielectric device according to the present embodiment is applied.

As shown in FIG. 4, the display 100 includes a light-emitting panel 101. The light-emitting panel 101 includes a transparent plate 101a, a collector electrode 101b, and a phosphor layer 101c.

The transparent plate 101a is formed of a glass plate or an acrylic plate. The collector electrode 101b is formed on the surface on the lower side (as viewed in FIG. 4) of the transparent plate 101a. The collector electrode 101b is formed of a transparent electrode such as an indium tin oxide (ITO) thin film.

The phosphor layer 101c is formed on the lower surface of the collector electrode 101b. The phosphor layer 101c is configured such that when electrons flying toward the collector electrode 101b, which is connected to a bias voltage source 102 via a predetermined resistor, collide with the phosphor layer 101c, fluorescence can be emitted. The bias voltage source 102 is configured to apply a predetermined collector voltage Vc between the ground and the collector electrode 101b.

As shown in FIG. 4, an electron-emitting device 110 is provided below the light-emitting panel 101. The electron-emitting device 110 is electrically connected to a pulse generator 110a. The electron-emitting device 110 is configured such that when a drive voltage Va is applied thereto by means of the pulse generator 110a, electrons are emitted toward the light-emitting panel 101 (the collector electrode 101b and the phosphor layer 101c).

A predetermined space is provided between the electron-emitting device 110 and the light-emitting panel 101 (phosphor layer 101c). The space between the electron-emitting device 110 and the phosphor layer 101c is a reduced-pressure atmosphere having a predetermined vacuum level of, for example, $10^2$ to $11^{-6}$ Pa (more preferably $10^{-3}$ to $10^{-5}$ Pa).

The display 100 is configured such that electrons are emitted, to the reduced-pressure atmosphere, from the electron-emitting device 110 through application of the drive voltage Va to the device 110 by means of the pulse generator 110a, and that, by means of an electric field generated through application of the collector voltage Vc, the thus-emitted electrons fly toward the collector electrode 101b and collide with the phosphor layer 101c, whereby fluorescence is emitted.

Configuration of Electron-Emitting Device

The electron-emitting device 110 is configured so as to have a thin flat plate shape. The electron-emitting device 110 includes a number of two-dimensionally arranged electron emitters 120 according to the present embodiment. Each of the electron emitters 120 includes a substrate 121, a lower electrode 122, an emitter layer 123, and an upper electrode 124.

The substrate 121 is formed of a heat-resistant glass thin plate or a ceramic thin plate. The lower electrode 122 is formed on the substrate 121. The lower electrode 122 is electrically connected to the aforementioned pulse generator 110a. The emitter layer 123, which constitutes a dielectric layer according to the present invention, is provided on the lower electrode 122.

The emitter layer 123 is formed to have a thickness of 1 to 300 μm (more preferably about 5 to about 100 μm). Microscopic concavities and convexities due to, for example, crystal grain boundaries are formed on an upper surface 123a of the emitter layer 123. Specifically, numerous concavities 123a1 are formed on the upper surface 123a. The upper surface 123a is formed so as to have a surface roughness Ra (centerline average roughness, unit: μm) of 0.005 or more and 3.0 or less. The emitter layer 123 is formed on the lower electrode 122 such that a lower surface 123b of the layer 123, which is opposite the upper surface 123a, is in contact with the lower electrode 122.

In the present embodiment, as described above, a portion of the emitter layer 123 on the side of the lower surface 123b (i.e., a lower-electrode-adjacent portion 123c) and a portion of the emitter layer 123 on the side of the upper surface 123a (i.e., an upper-surface-adjacent portion 123d) are formed under predetermined film formation conditions such that each of the portions 123c and 123d has a predetermined porosity and contains the aforementioned metal in a predetermined state.

The upper electrode 124 is provided on the upper surface 123a of the emitter layer 123. The upper electrode 124 is formed so as to have a thickness of about 0.1 to about 20 μm. The upper electrode 124 is electrically connected to the aforementioned pulse generator 110a.

The upper electrode 124 has a plurality of openings 124a. The openings 124a are formed such that the upper surface 123a of the emitter layer 123 is exposed to the outside of the electron-emitting device 110 (i.e., the aforementioned reduced-pressure atmosphere; the same shall apply hereinafter). The upper surface 123a of the emitter layer 123 is exposed to the outside of the electron-emitting device 110 also at peripheral edge portions 124b of the upper electrode 124. A portion of the emitter layer 123 exposed to the outside of the electron-emitting device 110 constitutes an emitter section 125, which serves as a main section for electron emission.

As described below, the electron emitter 120 is configured such that electrons supplied from the upper electrode 124 are accumulated on the emitter section 125, and the thus-accumulated electrons are emitted toward the outside of the electron-emitting device 110 (i.e., toward the phosphor layer 101c).

Detailed Description of Electron Emitter

Figure 5:
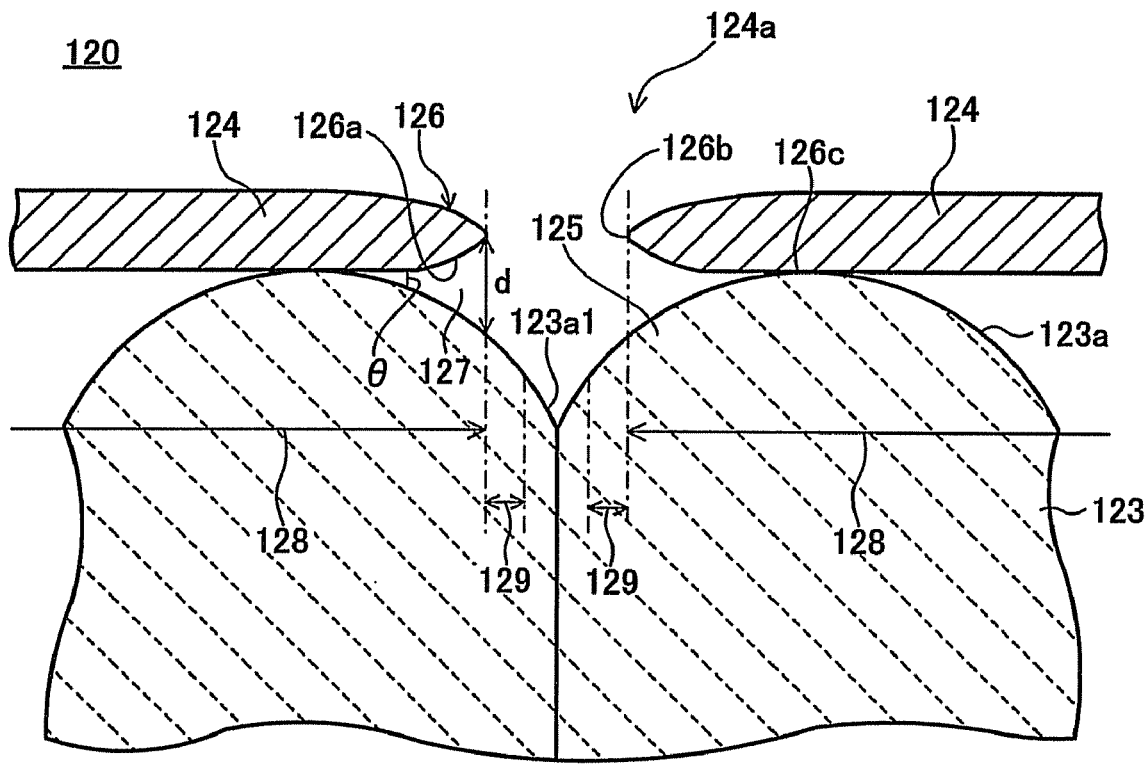
FIG. 5 is an enlarged cross-sectional view showing essential portions of the electron emitter of FIG. 4.

FIG. 5 is an enlarged cross-sectional view showing essential portions of the electron emitter 120 of FIG. 4. In the case shown in FIG. 5 (or FIG. 4), the concavities 123a1 and the openings 124a are formed in one-to-one correspondence. However, in some cases, a plurality of concavities 123a1 may be formed in a single opening 124a, or no concavities 123a1 may be formed in an opening 124a.

As shown in FIG. 5, in the upper electrode 124, a peripheral portion 126, which is a portion in the vicinity of the opening 124a, is provided so as to overhang the emitter section 125 (hereinafter the portion may be referred to as an "overhanging portion"). Specifically, the overhanging portion 126 is formed such that a lower surface 126a and a tip end 126b of the overhanging portion 126 are apart from the upper surface 123a of the emitter layer 123 corresponding to the emitter section 125. The overhanging portion 126 is also formed at positions corresponding to the peripheral edge portions 124b (see FIG. 4) of the upper electrode 124.

A triple junction 126c is formed at a position at which the overhanging portion 126 is in contact with the upper surface 123a of the emitter layer 123; i.e., at a position at which the emitter layer 123 is in contact with the upper electrode 124 and the aforementioned reduced-pressure atmosphere.

The triple junction 126c is a site (electric field concentration point) at which lines of electric force concentrate (where electric field concentration occurs) when, as shown in FIG. 4, a drive voltage Va is applied between the lower electrode 122 and the upper electrode 124. As used herein, the expression "site at which lines of electric force concentrate" refers to a site at which lines of electric force that are generated from the lower electrode 122 at even intervals concentrate, when the electric force lines are drawn under the assumption that the lower electrode 122, the emitter layer 123, and the upper electrode 124 are flat plates each having a cross section extending infinitely. The state of the concentration of lines of electric force (i.e., the state of electric field concentration) can be readily observed through simulation by means of numerical analysis employing the finite-element method.

As shown in FIG. 5, a gap 127 is formed between the lower surface 126a and tip end 126b of the overhanging portion 126 and the upper surface 123a (emitter section 125) of the emitter layer 123. The gap 127 is formed such that the maximum gap d satisfies the following relation: $0\ \mu m < d \leq 10\ \mu m$, and the angle θ between the lower surface 126a and the surface of the emitter section 125 satisfies the following relation: $1° \leq \theta \leq 60°$.

The tip end 126b of the overhanging portion 126 has such a shape as to serve as the aforementioned electric field concentration point. Specifically, the overhanging portion 126 has such a cross-sectional shape as to be acutely pointed toward the tip end 126b of the portion 126; i.e., the thickness gradually decreases.

The openings 124a may be formed to assume a variety of shapes as viewed in plane (as viewed from above in FIG. 5), including a circular shape, an elliptical shape, a polygonal shape, and an irregular shape. The openings 124a are formed such that the average of diameters of the openings 124a as viewed in plane is 0.1 μm or more and 20 μm or less. The reason for this is described below. As used herein, the expression "the average of diameters of the openings 124a" refers to the number-based average of diameters of circles having areas identical to those of the openings 124a.

As shown in FIG. 5, regions of the emitter layer 123 where polarization is inverted in accordance with application of the aforementioned drive voltage (drive voltage Va shown in FIG. 4) are first regions 128 and second regions 129. The first regions 128 correspond to regions facing the upper electrode 124. The second regions 129 correspond to regions of the openings 124a that extend from the tip ends 126b of the overhanging portions 126 toward the centers of the openings 124a. The range of the second regions 129 varies depending on the level of the drive voltage Va and the degree of electric field concentration in the vicinity of the second regions 129.

When the average diameter of the openings 124a falls within the above-described range (i.e., 0.1 μm or more and 20 μm or less), a sufficient quantity of electrons are emitted through the openings 124a, and high electron emission efficiency is secured.

When the average diameter of the openings 124a is less than 0.1 μm, the area of the second regions 129 decreases. The second regions 129 constitute primary regions of the emitter section 125 which temporarily accumulates electrons supplied from the upper electrode 124 and then emits the electrons. Therefore, a decrease in area of the second regions 129 results in reduction of the quantity of electrons to be emitted. In contrast, when the average diameter of the openings 124a exceeds 20 μm, the ratio of the second regions 129 to the entirety of the emitter section 125 (occupancy of the second regions) decreases, resulting in reduction of electron emission efficiency.

Equivalent Circuit of Electron Emitter

Figure 6:
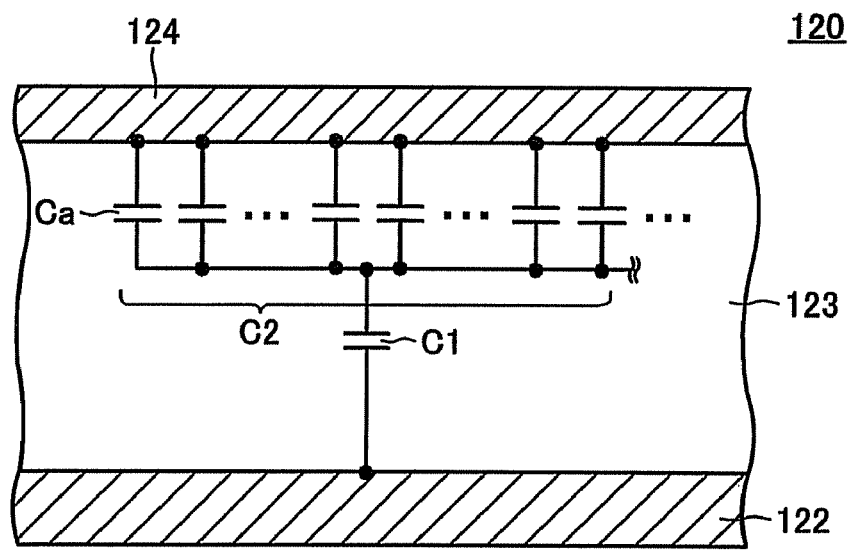
FIG. 6 shows an equivalent circuit of the electron emitter of FIG. 4.
Figure 7:
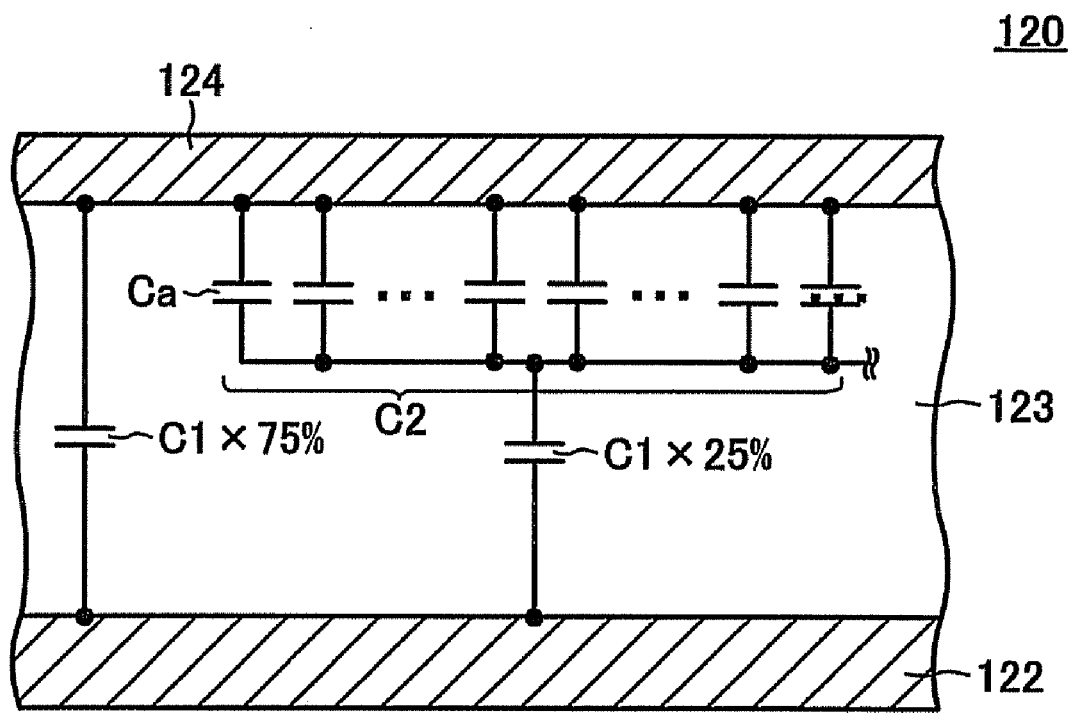
FIG. 7 shows an equivalent circuit of the electron emitter of FIG. 4.

FIGS. 6 and 7 show equivalent circuits of the electron emitter 120 of FIG. 4.

Most briefly, the configuration of the electron emitter 120 according to the present embodiment can be approximated to an equivalent circuit as shown in FIG. 6. "C1" of FIG. 6 is a capacitor formed by sandwiching the emitter layer 123 between the lower electrode 122 and the upper electrode 124. "Ca" of FIG. 6 is a capacitor formed by any of the gaps 127 (see FIG. 5). "C2" of FIG. 6 is a capacitor formed of an aggregate of a plurality of capacitors Ca, which are connected in parallel. The capacitor C1 associated with the emitter layer 123 is connected in series to the capacitor C2 associated with the gaps 127 (see FIG. 5).

However, the equivalent circuit, in which the capacitor C1 associated with emitter layer 123 is connected in series to the capacitor C2 formed of the aggregate of the capacitors Ca is not practical. In practice, conceivably, the percentage of a portion of the capacitor C1 associated with the emitter layer 123 that is connected in series to the capacitor C2 formed of the capacitor aggregate varies with, for example, the number and area of the openings 124a (see FIG. 5) formed in the upper electrode 124.

Capacitance will now be calculated under the assumption that, for example, 25% of the capacitor C1 associated with the emitter layer 123 is connected in series to the capacitor C2 as shown in FIG. 7.

Conditions of the calculation are as follows: the gaps 127 are in a vacuum (i.e., specific dielectric constant $\in_r=1$); the maximum gap d of the gaps 127 is 0.1 μm; the area S of a region corresponding to a single gap 127 is 1 μm×1 μm; the number of the gaps 127 is 10,000; the specific dielectric constant of the emitter layer 123 is 2,000; the thickness of the emitter layer 123 is 20 μm; and the facing area between the lower electrode 122 and the upper electrode 124 is 200 μm×200 μm.

Under the above-described conditions, the capacitance of the capacitor C1 is 35.4 pF, and the capacitance of the capacitor C2 is 0.885 pF. The overall capacitance between the upper electrode 124 and the lower electrode 122 is 27.5 pF, which is lower than the capacitance of the capacitor C1 associated with the emitter layer 123 (i.e., 35.4 pF); i.e., the overall capacitance is 78% the capacitance of the capacitor C1.

As described above, the overall capacitance of the capacitor C2 formed of the aggregate of the capacitors Ca associated with the gaps 127 (see FIG. 5) is considerably lower than the capacitance of the capacitor C1 (associated with the emitter layer 123) which is connected in series to the capacitor C2. Therefore, when the drive voltage Va is applied to this series circuit, most of the voltage Va is applied to the capacitors Ca (C2), whose capacitance is lower than that of the capacitor C1. In other words, most of the drive voltage Va is applied to the gaps 127 (see FIG. 5). This attains an increase in output of the electron emitter.

As described above, the capacitor C1 associated with the emitter layer 123 is connected in series to the capacitor C2 formed of the aggregate of the capacitors Ca associated with the gaps 127 (see FIG. 5). Therefore, the overall capacitance of this series circuit is lower than the capacitance of the capacitor C1 associated with the emitter layer 123. Therefore, the electron emitter exhibits a preferred property (i.e., reduction of overall power consumption).

Electron Emission Principle of Electron Emitter

Figure 8:
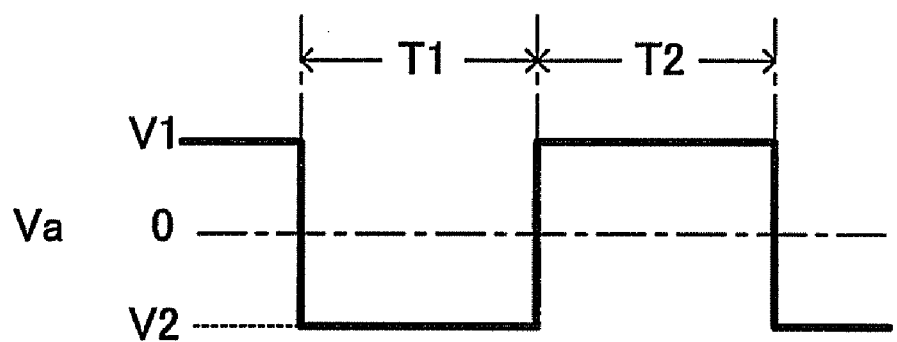
FIG. 8 is a diagram showing the waveform of a drive voltage applied to the electron emitter of FIG. 4.

FIG. 8 is a diagram showing the waveform of a drive voltage Va applied to the electron emitter 120 shown in FIG. 4. FIGS. 9 and 10 each show the state of operation of the electron emitter 120 of FIG. 4 in the case where the drive voltage Va shown in FIG. 8 is applied to the electron emitter 120. Next will be described the principle of electron emission of the electron emitter 120 with reference to FIGS. 8 to 10.

In the present embodiment, as shown in FIG. 8, the drive voltage Va to be applied is an alternating voltage of rectangular waveform (period: T1+T2). In the drive voltage Va, the reference voltage (voltage corresponding to the center of the wave) is 0 V.

As shown in FIGS. 8 to 10, in the drive voltage Va, during time T1 corresponding to the first stage, the electric potential of the upper electrode 124 is V2 (negative voltage), which is lower than the electric potential of the lower electrode 122; and during time T2 corresponding to the second stage, the electric potential of the upper electrode 124 is V1 (positive voltage), which is higher than the electric potential of the lower electrode 122.

Figure 9A:
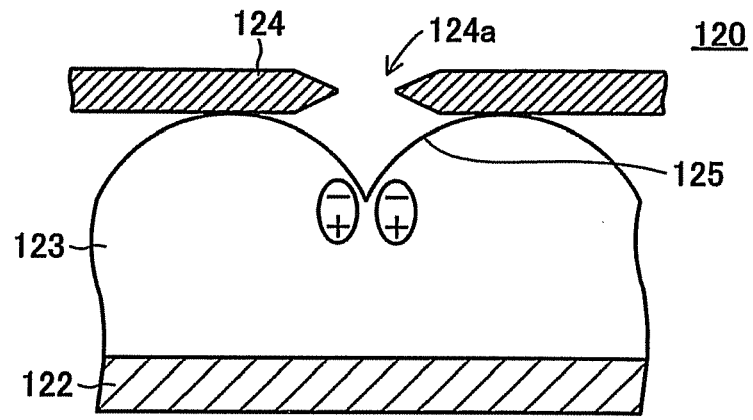
FIGS. 9A to 9C show the state of operation of the electron emitter of FIG. 4 in the case where the drive voltage shown in FIG. 8 is applied to the electron emitter.

As shown in FIG. 9A, in the initial state, the emitter section 125 is polarized unidirectionally, and the negative poles of dipoles face toward the upper surface 123a of the emitter layer 123.

Firstly, in the initial state, in which the reference voltage is applied, as shown in FIG. 9A, the emitter section 125 is polarized such that the negative poles of dipoles face toward the upper surface 123a of the emitter layer 123. In this state, virtually no electrons are accumulated on the emitter section 125.

Figure 9B:
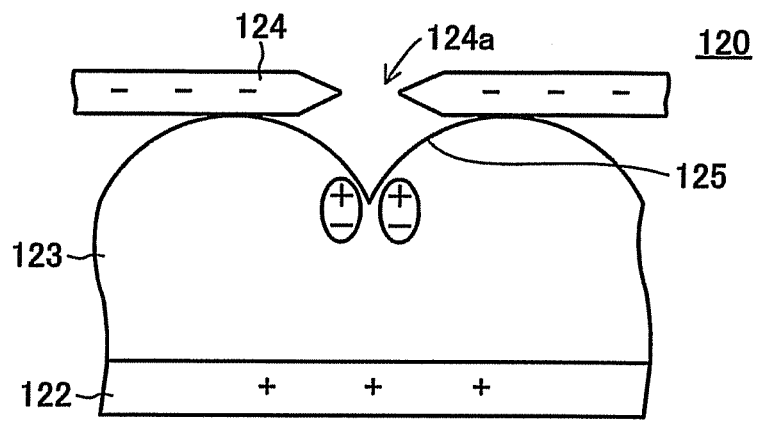

Subsequently, as shown in FIG. 9B, when the negative voltage V2 is applied, polarization is inverted. This inversion of polarization causes electric field concentration to occur at the aforementioned electric field concentration points.

Figure 9C:
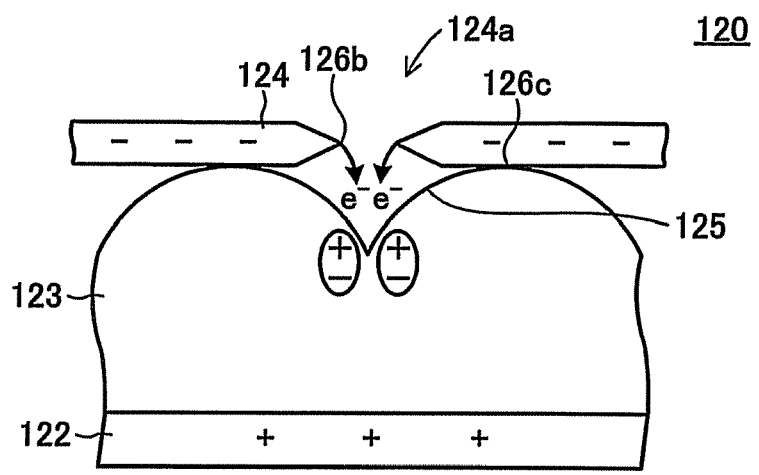

Through this electric field concentration, electrons are supplied from the electric field concentration points of the upper electrode 124 toward the emitter section 125, and then, as shown in FIG. 9C, electrons are accumulated on the emitter section 125. In other words, the emitter section 125 is electrically charged. This electrical charging can be continued until a predetermined saturated condition, which depends on the surface resistance of the emitter layer 123, is attained. The quantity of the charge can be controlled on the basis of voltage application time or voltage waveform. Thus, the upper electrode 124 (in particular, the aforementioned electric field concentration points) functions as an electron supply source for the emitter section 125.

Figure 10A:
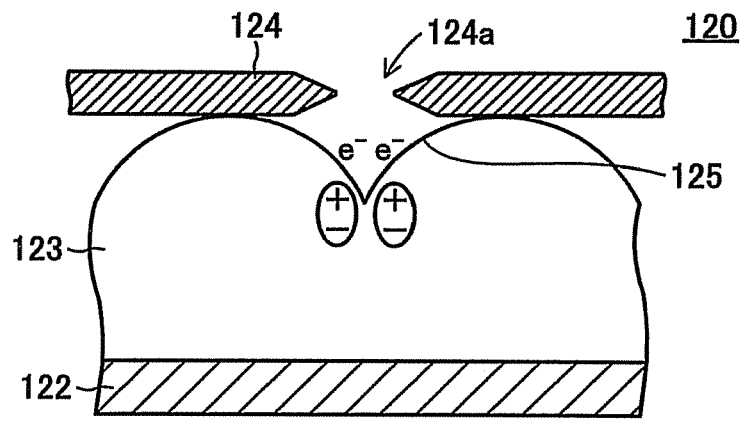
FIGS. 10A to 10C show the state of operation of the electron emitter of FIG. 4 in the case where the drive voltage shown in FIG. 8 is applied to the electron emitter.
Figure 10B:
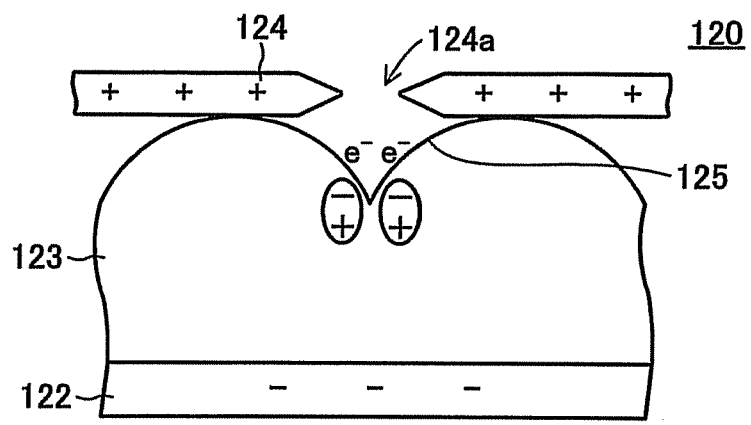
Figure 10C:
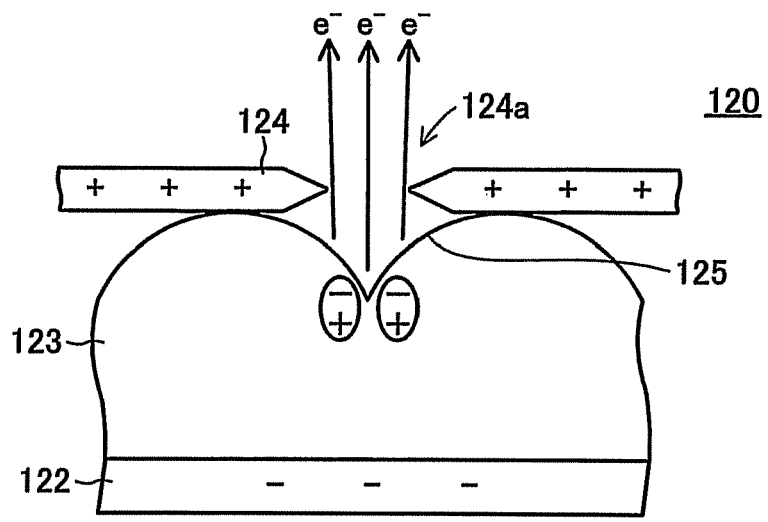

Subsequently, when the drive voltage Va is changed to the reference voltage as shown in FIG. 10A, and then the positive voltage V1 is applied as shown in FIG. 10B, polarization is re-inverted. As a result, electrostatic repulsion between the accumulated electrons and the negative poles of dipoles causes the electrons to be emitted from the emitter section 125 toward the outside of the electron emitter 120 through the opening 124a as shown in FIG. 10C.

In a manner similar to that described above, electrons are emitted from the peripheral edge portions 124b (see FIG. 4) of the upper electrode 124.

General Description of Piezoelectric Actuator

Figure 11A:
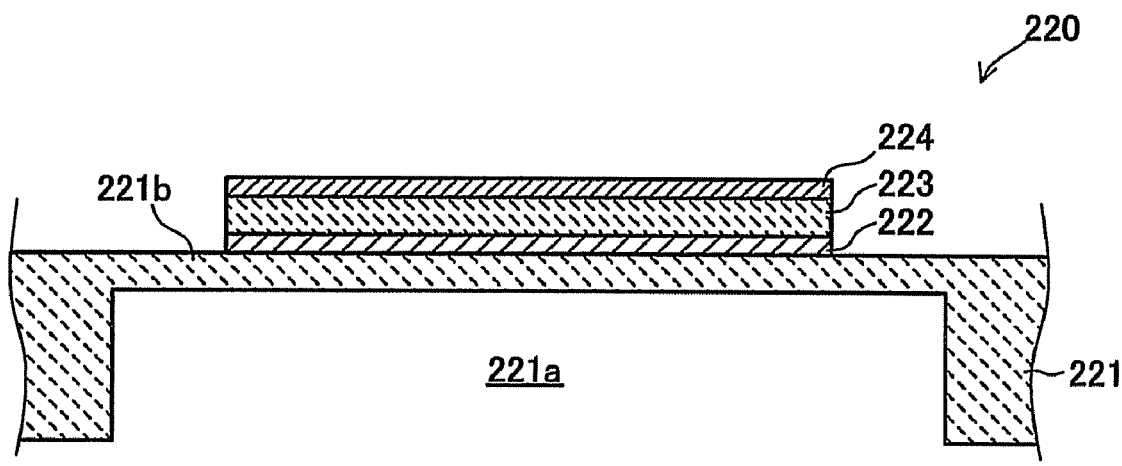
FIGS. 11A and 11B are cross-sectional views schematically showing the configuration of a piezoelectric actuator, which is a dielectric device according to the embodiment.
Figure 11B:
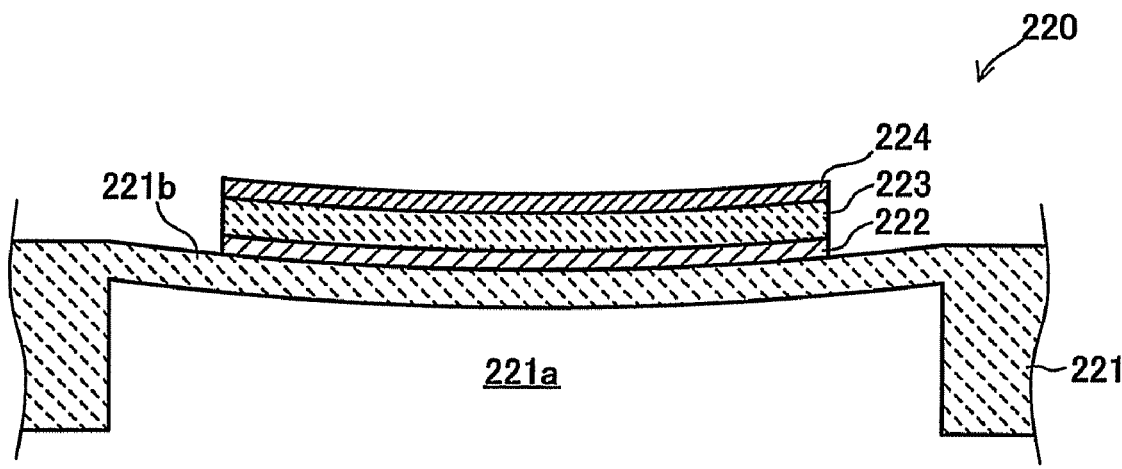
Figure 12A:
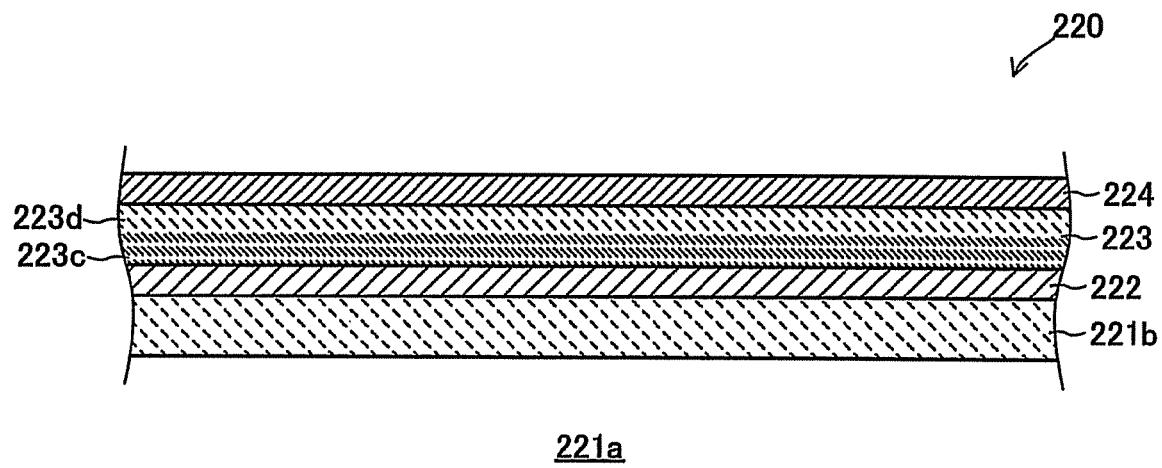
FIGS. 12A and 12B are enlarged cross-sectional views showing essential portions of the piezoelectric actuator of FIGS. 11A and 11B.
Figure 12B:
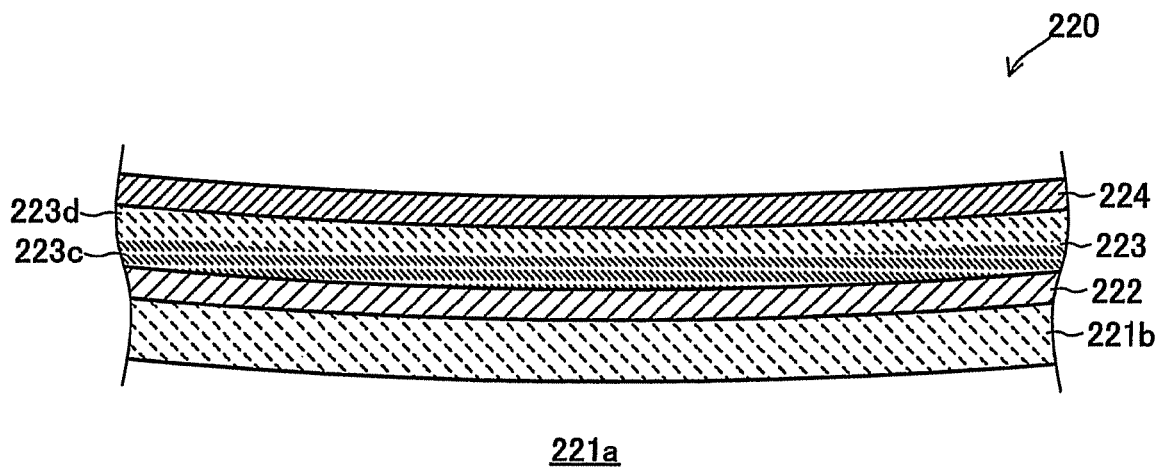

FIGS. 11A and 11B are cross-sectional views schematically showing the configuration of a piezoelectric actuator 220, which is a dielectric device according to the present embodiment. FIGS. 12A and 12B are enlarged cross-sectional views showing essential portions of the piezoelectric actuator 220 of FIGS. 11A and 11B.

As shown in FIGS. 11A and 11B, a substrate 221, which constitutes the lowermost layer of the piezoelectric actuator 220, is formed of a ceramic thin plate. The thickness of the substrate 221 is preferably 3 μm to 1 mm, more preferably 5 to 500 μm, particularly preferably 7 to 200 μm, from the viewpoints of mechanical strength and the degree of bending displacement attained by the piezoelectric actuator 220.

As shown in FIGS. 11A and 11B, a cavity 221a is provided below the substrate 221. A small-thickness portion provided above the cavity 221a forms a vibration plate 221b which assumes a beam supported at both ends.

A lower electrode 222 is bonded onto the surface of the vibration plate 221b (upper surface in FIGS. 11A and 11B), which is opposite the surface facing the cavity 221a. A piezoelectric/electrostrictive layer 223, which constitutes the dielectric layer according to the present invention, is bonded onto the lower electrode 222. An upper electrode 224 is bonded onto the piezoelectric/electrostrictive layer 223.

As shown in FIGS. 11A and 11B, the piezoelectric actuator 220 is configured such that when a predetermined drive voltage is applied between the lower electrode 222 and the upper electrode 224 in a thickness direction of the piezoelectric/electrostrictive layer 223, the vibration plate 221b can be bent or deformed through expansion and contraction of the piezoelectric/electrostrictive layer 223 in a direction perpendicular to the thickness direction, the expansion and contraction occurring through the transverse piezoelectric effect.

As shown in FIGS. 12A and 12B, in the present embodiment, a portion of the piezoelectric/electrostrictive layer 223 on the side of the lower electrode 222 (i.e., a lower-electrode-adjacent portion 223c) and a portion of the piezoelectric/electrostrictive layer 223 on the side of the upper electrode 224 (i.e., an upper-surface-adjacent portion 223d) are formed under the aforementioned predetermined film formation conditions such that each of the portions 223c and 223d has a predetermined porosity and contains the aforementioned metal in a predetermined state.

EXAMPLES

Next will be described, with reference to Comparative Examples, Examples of the aforementioned electron emitter 120 and piezoelectric actuator 220, which are dielectric devices according to the present embodiment.

Example 1

The electron emitter 120 of Example 1 (see FIG. 4) employs a zirconia substrate serving as a substrate 121. A lower electrode 122 is formed by coating the substrate 121 with a platinum paste through screen printing, followed by firing of the resultant coating film.

An emitter layer 123 is formed to have a thickness of 10 to 20 μm. The emitter layer 123 contains PZT (Zr:Ti=52:48) as the aforementioned dielectric material, and silver as the aforementioned metal.

An upper electrode 124 formed of flaky graphite powder is provided on the emitter layer 123. The upper electrode 124 is formed by coating the emitter layer 123 with a dispersion liquid prepared through dispersion of flaky graphite powder in a solvent containing an organic binder, followed by firing of the resultant coating film.

The aforementioned powdery dielectric material contained in raw material powder 81 (see FIG. 3) is PZT (Zr:Ti=52:48) having a number-based mean particle size of 1.0 μm. The aforementioned fine-particulate metal contained in the raw material powder 81 is silver having a number-based mean particle size of 0.35 μm. A film is formed on the substrate 121 (accurately, on the lower electrode 122 shown in FIG. 4) from the raw material powder 81 by means of an aerosol deposition apparatus 60, and subsequently the film is thermally treated for one hour in an electric furnace, to thereby form the emitter layer 123 shown in FIG. 4.

Table 1 shows the relation between the silver content before thermal treatment, thermal treatment temperature, silver content and porosity after thermal treatment, and electron emission efficiency of the emitter layer 123.

The silver content and porosity after thermal treatment can be determined through image analysis of a scanning electron micrograph of a cross-section of the emitter layer 123.

Electron emission property is obtained as follows.

As shown in FIG. 4, when Va represents drive voltage applied between the lower electrode 122 and the upper electrode 124; Vc represents electron accelerating voltage (collector voltage) of a bias voltage source 102 for generating an external electric field which causes electrons emitted from the electron emitter 120 to fly toward a light-emitting panel 101; $i_c$ represents current due to the electrons emitted from the electron emitter 120 (i.e., current which flows between the bias voltage source 102 and a collector electrode 101b); and P represents drive power for the electron emitter 120, electron emission efficiency η is represented by the following formula:

$$\eta = Vc \times i_c / (P + Vc \times i_c)$$

Figure 13:
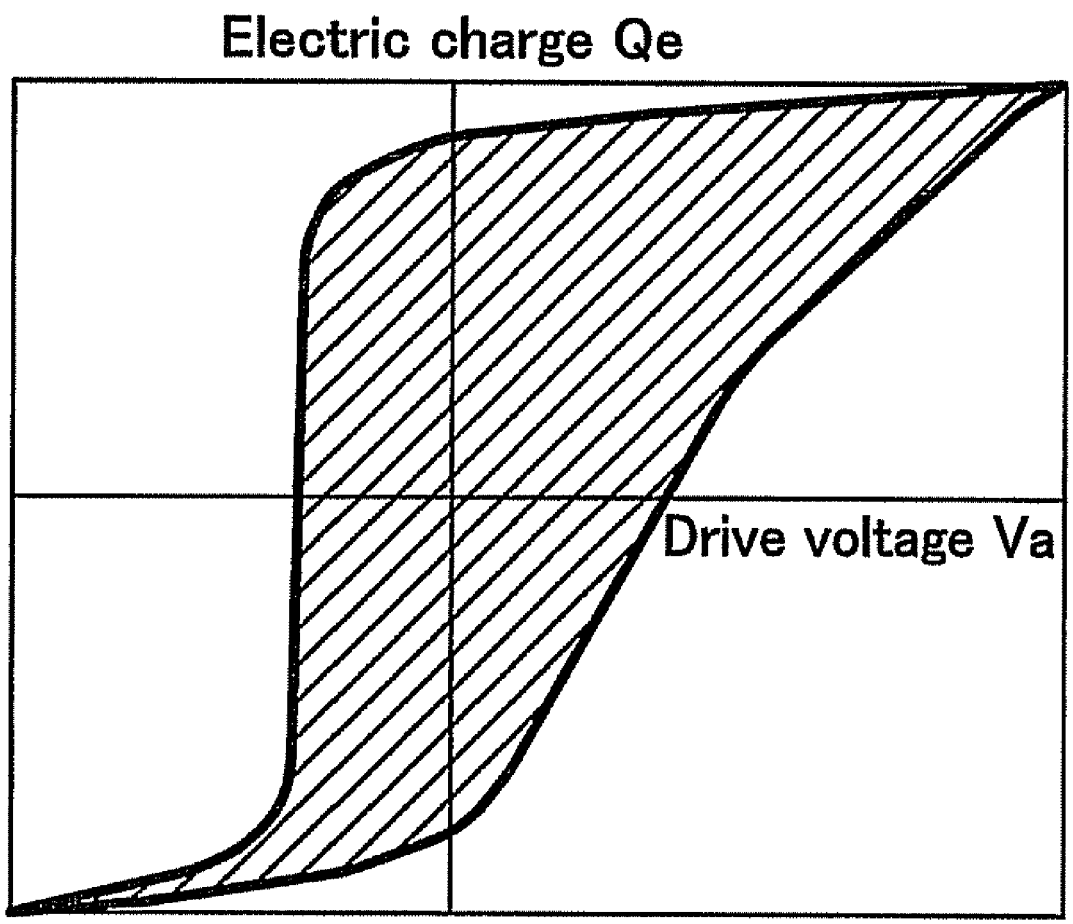
FIG. 13 shows the Q-V hysteresis of a dielectric material constituting the emitter layer shown in FIG. 4.

(wherein drive power P=[hysteresis loss of electron emitter: P1]+[resistance loss in drive circuit: P2]). P1 is the area enclosed by the Q-V hysteresis loop shown in FIG. 13 (i.e., the area of the shaded portion shown in FIG. 13). P2, which varies with the method for driving the electron emitter, is represented by the following inequality: $0 \leq P2 \leq$ (drive voltage Va×electric charge Qe)−(the area enclosed by the Q-V hysteresis loop)=(the area of a portion outside the shaded portion shown in FIG. 13). In this inequality, 0 on the left side corresponds to the case where the electron emitter 120 is driven so that the drive power satisfies the Q-V hysteresis.

TABLE 1

| | Silver content before thermal treatment (by volume: %) | Thermal treatment temperature (° C.) | Silver content after thermal treatment (by volume: %) | Porosity after thermal treatment (%) | Electron emission efficiency |
|---|---|---|---|---|---|
| 1-1 | 0 | 800 | 0 | <0.5 | CC |
| 1-2 | 1 | 800 | 0 | 1 | CC |
| 1-3 | 3 | 800 | 0 | 2 | BB |
| 1-4 | 7 | 700 | 6 | 1 | CC |
| 1-5 | 9 | 750 | 2 | 8 | BB |
| 1-6 | 9 | 800 | 0 | 11 | AA |
| 1-7 | 19 | 700 | 12 | 10 | DD to CC |
| 1-8 | 19 | 750 | 5 | 17 | BB |
| 1-9 | 19 | 800 | 0 | 20 | BB |
| 1-10 | 32 | 700 | 15 | 18 | DD |
| 1-11 | 32 | 750 | 10 | 24 | DD to CC |
| 1-12 | 32 | 800 | 0 | 33 | CC |

As is clear from Table 1, the electron emitters of Nos. 1-3, 1-5, 1-6, 1-8, and 1-9, in which the silver content after thermal treatment is 10% or less and the porosity after thermal treatment falls within a range of 2% to 20%, exhibit relatively good electron emission efficiency.

In the electron emitters of Nos. 1-6 and 1-9, the silver content after thermal treatment is almost 0%. This is because thermal treatment causes migration of silver in the aforementioned film layer, which constitutes the emitter layer 123, resulting in localization of silver in the vicinity of the interface between the lowermost part of the lower-electrode-adjacent portion 123c and the lower electrode 122, or bleeding of silver to a portion above the upper surface 123a.

In the thus-formed emitter layer 123, lattice defect, lattice strain, etc. are reduced and crystallinity is improved-through thermal treatment, and the silver content and porosity fall within the above-described ranges through the aforementioned silver migration associated with thermal treatment. Thus, the emitter layer 123 exhibits, for example, dielectric constant and polarization inversion property suitable for electron emission.

For example, according to the present Example, there is formed an emitter layer 123 in which the silver content of the lower-electrode-adjacent portion 123c differs from that of the upper-surface-adjacent portion 123d, and the porosity is regulated to a predetermined level.

Specifically, for example, there is formed an emitter layer 123 having a silver content gradient in a thickness direction (e.g., the silver content decreases from the lower surface 123b toward the upper surface 123a). Alternatively, there is formed an emitter layer 123 as in the case of No. 1-6 or 1-9, in which almost the entirety of silver is bled out in the vicinity of the upper surface 123a. In this case, when the amount of the metal dispersed in the lower-electrode-adjacent portion 123c is regulated to be greater than that of the metal dispersed in the upper-surface-adjacent portion 123d, the dielectric constant of the lower-electrode-adjacent portion 123c becomes higher than that of the upper-surface-adjacent portion 123d. Therefore, electric field concentration occurs in the upper-surface-adjacent portion 123d. This electric field concentration increases the quantity of electrons to be emitted and improves electron emission efficiency.

In contrast, the electron emitters of Nos. 1-1, 1-2, and 1-4, in which the silver content after thermal treatment is 10% or less but the porosity after thermal treatment is less than 2%, are inferior to the aforementioned electron emitters of Nos. 1-3, 1-5, 1-6, 1-8, and 1-9 in terms of electron emission quantity and electron emission efficiency (the electron emitter of No. 1-1 corresponds to a conventional electron emitter containing no silver). That is, the electron emitters of Nos. 1-1, 1-2, and 1-4 fail to exhibit improvement in electron emission quantity and electron emission efficiency.

This is considered to be due to insufficient improvement of properties of the emitter layer 123 (serving as a dielectric layer) resulting from migration of silver through thermal treatment and an increase in porosity associated with the silver migration.

Specifically, among the electron emitters of Nos. 1-4, 1-5, and 1-6, the silver content before thermal treatment (i.e., the amount of silver added during film formation) is the same, and the thermal treatment temperature is different. The higher the thermal treatment temperature, the lower the silver content after thermal treatment, and the higher the porosity. In the electron emitter of No. 1-4, in which the thermal treatment temperature is relatively low, the silver content after thermal treatment is not so reduced, and the porosity is not so increased. In contrast, in the electron emitter of No. 1-5 or 1-6, in which the thermal treatment temperature is relatively high, the porosity is increased, and the silver content after thermal treatment is reduced. Thus, in the electron emitter of No. 1-5 or 1-6, conceivably, properties of the emitter layer 123 (serving as a dielectric layer) are improved as a result of thermal treatment and silver migration through the thermal treatment.

The electron emitters of Nos. 1-7 and 1-10, in which the porosity after thermal treatment falls within a range of 2% to 20% but the silver content after thermal treatment exceeds 10%, fail to emit electrons properly. Specifically, in these electron emitters, unstable electron emission occurs, or short circuit between electrodes occurs frequently. This is considered to be due to impairment of properties of the emitter layer 123 (serving as a dielectric layer) as a result of a decrease in breakdown voltage of the entirety of the emitter layer 123 attributed to excessively high metal content of the emitter layer 123.

Similar to the cases of the electron emitters of Nos. 1-7 and 1-10, the electron emitters of Nos. 1-11 and 1-12, in which the silver content after thermal treatment is 10% or less but the porosity after thermal treatment exceeds 20%, fail to emit electrons properly. This is considered to be due to a decrease in breakdown voltage of the entirety of the emitter layer 123, and as well impairment of polarization inversion property.

Example 2

The piezoelectric actuator 220 of Example 2 (see FIG. 11) employs a zirconia ceramic substrate serving as a substrate 221. A lower electrode 222 is formed by coating the substrate 221 with a platinum paste through screen printing, followed by firing of the resultant coating film.

A piezoelectric/electrostrictive layer 223 is formed to have a thickness of 10 to 20 μm. The piezoelectric/electrostrictive layer 223 contains PZT (Zr:Ti=52:48) as the aforementioned dielectric material, and silver as the aforementioned metal. The piezoelectric/electrostrictive layer 223 is formed under conditions similar to those employed in the case of Example 1.

An upper electrode 224 formed of gold thin film is provided on the piezoelectric/electrostrictive layer 223. The upper electrode 224 is formed by coating the piezoelectric/electrostrictive layer 223 with a gold paste through screen printing, followed by firing of the resultant coating film.

Table 2 shows the relation between the silver content before thermal treatment, thermal treatment temperature, and silver content and porosity after thermal treatment of the piezoelectric/electrostrictive layer 223, and the bending displacement of the piezoelectric actuator 220. The bending displacement can be measured by means of a laser Doppler vibrometer.

TABLE 2

| | Silver content before thermal treatment (by volume: %) | Thermal treatment temperature (° C.) | Silver content after thermal treatment (by volume: %) | Porosity after thermal treatment (%) | Bending displacement |
|---|---|---|---|---|---|
| 2-1 | 0 | 800 | 0 | <0.5 | CC |
| 2-2 | 1 | 800 | 0 | 1 | CC |
| 2-3 | 3 | 800 | 0 | 2 | BB |
| 2-4 | 7 | 700 | 6 | 1 | DD to CC |
| 2-5 | 10 | 750 | 2 | 9 | BB |
| 2-6 | 10 | 800 | 0 | 13 | AA |
| 2-7 | 21 | 700 | 12 | 12 | CC |
| 2-8 | 21 | 750 | 5 | 17 | BB |
| 2-9 | 21 | 800 | 0 | 21 | BB |
| 2-10 | 32 | 700 | 13 | 18 | DD |
| 2-11 | 32 | 750 | 10 | 23 | DD |
| 2-12 | 32 | 800 | 0 | 35 | DD |

As is clear from Table 2, the piezoelectric actuators of Nos. 2-3, 2-5, 2-6, and 2-8, in which the silver content after thermal treatment is 10% or less and the porosity after thermal treatment falls within a range of 2% to 20%, exhibit relatively good bending displacement.

In contrast, the piezoelectric actuators of Nos. 2-1 (corresponding to a conventional piezoelectric actuator containing no silver), 2-2, and 2-4, in which the silver content after thermal treatment is 10% or less but the porosity after thermal treatment is less than 2%, are inferior to the aforementioned piezoelectric actuators of Nos. 2-3, 2-5, 2-6, and 2-8 in terms of bending displacement. That is, the piezoelectric actuators of Nos. 2-1, 2-2, and 2-4 fail to exhibit improvement in bending displacement.

In the piezoelectric actuators of Nos. 2-7 and 2-10, in which the porosity after thermal treatment falls within a range of 2% to 20% but the silver content after thermal treatment exceeds 10%, short circuit between electrodes occurs frequently, and proper bending displacement fails to be attained. This is considered to be due to impairment of properties of the piezoelectric/electrostrictive layer 223 (serving as a dielectric layer) as a result of a decrease in breakdown voltage of the entirety of the piezoelectric/electrostrictive layer 223 attributed to excessively high metal content of the piezoelectric/electrostrictive layer 223.

Similar to the cases of the piezoelectric actuators of Nos. 2-7 and 2-10, in the piezoelectric actuators of Nos. 2-11 and 2-12, in which the silver content after thermal treatment is 10% or less but the porosity after thermal treatment exceeds 20%, proper bending displacement fails to be attained. This is considered to be due to a decrease in withstand voltage of the entirety of the piezoelectric/electrostrictive layer 223, and as well impairment of piezoelectric properties.

The piezoelectric actuator of No. 2-9, in which the porosity after thermal treatment slightly exceeds 20% but the silver content after thermal treatment is almost 0%, exhibits relatively good bending displacement. The results imply that piezoelectric properties of the piezoelectric/electrostrictive layer 223 are affected not by the porosity of the layer, but mainly by migration of silver (the aforementioned metal) in the layer and the silver content of the layer.

Example 3

The electron emitter 120 of Example 3 (see FIG. 4) employs a soda glass substrate serving as a substrate 121. A lower electrode 122 and an upper electrode 124 are formed in a manner similar to that of Example 1.

An emitter layer 123 is formed to have a thickness of 10 to 20 μm. The emitter layer 123 contains PZT (Zr:Ti=52:48) as the aforementioned dielectric material, and silver as the aforementioned metal.

Figure 14:
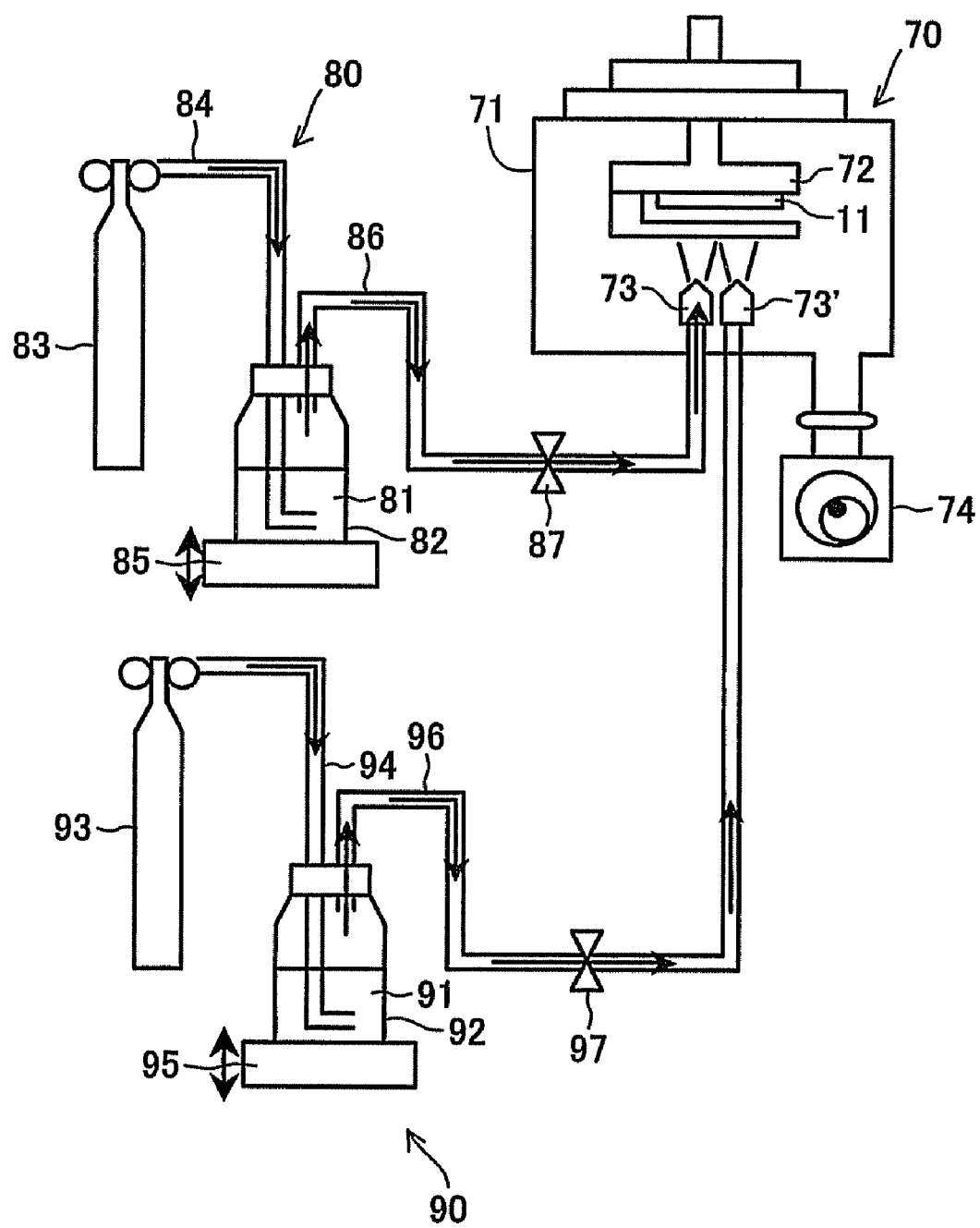
FIG. 14 schematically shows the configuration of an aerosol deposition apparatus employed in the film layer formation step shown in FIG. 2, the apparatus being employed in Examples 3 and 4.

In the present Example, the emitter layer 123 is formed by means of an aerosol deposition apparatus 60 as shown in FIG. 14. The aerosol deposition apparatus 60 includes a deposition chamber 70. The deposition chamber 70 includes a nozzle 73 and an additional nozzle 73' therein.

The aerosol deposition apparatus 60 includes an aerosol supply unit 80 and an additional aerosol supply unit 90. The aerosol supply unit 90 has the same configuration as the aerosol supply unit 80, and is configured such that an aerosol containing raw material powder 91 can be supplied to the nozzle 73'. The aerosol supply unit 90 includes a second aerosol chamber 92, a compressed gas supply source 93, a compressed gas supply tube 94, a vibration stirring section 95, an aerosol supply tube 96, and a control valve 97.

In the aerosol deposition apparatus 60 shown in FIG. 14, the metal content of the raw material powder 81 differs from that of the raw material powder 91. Specifically, the aerosol deposition apparatus 60 of FIG. 14 is configured such that the raw material powder 81 and the raw material powder 91, which are different in the ratio of incorporated dielectric material powder to incorporated fine metal particles, can be separately sprayed through the nozzle 73 and the nozzle 73', respectively.

When, in the aerosol deposition apparatus 60, spraying through the nozzle 73 and spraying through the nozzle 73' are appropriately switched with each other, while the raw material powder 81 contained in the aerosol chamber 82 or the raw material powder 91 contained in the aerosol chamber 92 is appropriately replaced, a film is formed so that the ratio of dielectric material powder to fine metal particles is gradually varied in a thickness direction of the film. The thus-formed film layer is thermally treated in a manner similar to that described above. This procedure yields an emitter layer 123 in which the silver content of a lower-electrode-adjacent portion 123c differs from that of an upper-surface-adjacent portion 123d. Specifically, in the present Example, the emitter layer 123 is formed so that the metal content of the upper-surface-adjacent portion 123d is lower than that of the lower-electrode-adjacent portion 123c.

Table 3 shows the relation between the silver content of the lower-electrode-adjacent portion 123c after thermal treatment, the silver content of the upper-surface-adjacent portion 123d after thermal treatment, and the electron emission efficiency of the emitter layer 123.

The silver content of the lower-electrode-adjacent portion 123c (corresponding to "lower layer" described in Table 3) can be determined through image analysis of a scanning electron micrograph of a cross-section of a portion of the emitter layer 123, the portion being located in the vicinity of the interface between the lower electrode 122 and the emitter layer 123. Similarly, the silver content of the upper-surface-adjacent portion 123d (corresponding to "upper layer" described in Table 3) can be determined through image analysis of a scanning electron micrograph of a cross-section of a portion of the emitter layer 123, the portion being located below the lowermost end of concavities 123a1 formed on the upper surface 123a of the emitter layer 123.

TABLE 3

|  | Silver content after thermal treatment (lower layer: vol %) | Silver content after thermal treatment (upper layer: vol %) | Electron emission efficiency |
|---|---|---|---|
| 3-1 | 0 | 0 | CC |
| 3-2 | 2 | 0 | BB |
| 3-3 | 11 | 0 | AA |
| 3-4 | 18 | 0 | BB |
| 3-5 | 22 | 0 | CC |
| 3-6 | 8 | 2 | BB |
| 3-7 | 19 | 4 | BB |
| 3-8 | 20 | 7 | DD |

As is clear from Table 3, as compared with the electron emitter of No. 3-1 (corresponding to a conventional electron emitter containing no silver), the electron emitters of Nos. 3-2, 3-3, 3-4, 3-6, and 3-7, in which the silver content of the lower-electrode-adjacent portion 123c (corresponding to "lower layer" described in Table 3) falls within a range of 2% to 20%, and the silver content of the upper-surface-adjacent portion 123d (corresponding to "upper layer" described in Table 3) is 5% or less, exhibit relatively good electron emission efficiency.

In the electron emitters of Nos. 3-2, 3-3, 3-4, 3-6, and 3-7, which exhibit good properties, the metal content of the upper-surface-adjacent portion 123d is ¼ or less that of the lower-electrode-adjacent portion 123c. Particularly, in the electron emitters of Nos. 3-2, 3-3, and 3-4, the metal content of the upper-surface-adjacent portion 123d is almost zero.

Thus, in the present Example, when the amount of the metal dispersed in the lower-electrode-adjacent portion 123c is regulated to be greater than that of the metal dispersed in the upper-surface-adjacent portion 123d, the dielectric constant of the lower-electrode-adjacent portion 123c becomes higher than that of the upper-surface-adjacent portion 123d. Therefore, electric field concentration occurs in the upper-surface-adjacent portion 123d. This electric field concentration increases the quantity of electrons to be emitted and improves electron emission efficiency.

In contrast to these electron emitters, in the electron emitter of No. 3-5, in which the silver content of the lower-electrode-adjacent portion 123c exceeds 20%, dielectric breakdown occurs, and proper electron emission fails to be attained. Similar to the case of the electron emitter of No. 3-5, in the electron emitter of No. 3-8, in which the silver content of the upper-surface-adjacent portion 123d exceeds 5%, proper electron emission fails to be attained.

Example 4

The piezoelectric actuator 220 of Example 4 (see FIGS. 11 and 12) is formed in the same manner as that of Example 2, except that a piezoelectric/electrostrictive layer 223 is formed under conditions similar to the film formation conditions employed in Example 3.

Table 4 shows the relation between the silver content of a lower-electrode-adjacent portion 223c of the piezoelectric/electrostrictive layer 223 after thermal treatment, the silver content of an upper-surface-adjacent portion 223d of the layer 223, and the bending displacement of the piezoelectric actuator 220.

TABLE 4

|  | Silver content after thermal treatment (lower layer: vol %) | Silver content after thermal treatment (upper layer: vol %) | Bending displacement |
|---|---|---|---|
| 4-1 | 0 | 0 | CC |
| 4-2 | 2 | 0 | BB |
| 4-3 | 11 | 0 | BB |
| 4-4 | 18 | 0 | BB |
| 4-5 | 21 | 0 | CC |
| 4-6 | 28 | 0 | DD |
| 4-7 | 18 | 3 | BB |
| 4-8 | 20 | 7 | DD |

As is clear from Table 4, as compared with the piezoelectric actuator of No. 4-1 (corresponding to a conventional piezoelectric actuator containing no silver), the piezoelectric actuators of Nos. 4-2, 4-3, 4-4, and 4-7, in which the silver content of the lower-electrode-adjacent portion 223c (corresponding to "lower layer" described in Table 4) falls within a range of 2% to 20%, and the silver content of the upper-surface-adjacent portion 223d (corresponding to "upper layer" described in Table 4) is 5% or less, exhibit relatively good bending displacement.

In the piezoelectric actuators of Nos. 4-2, 4-3, 4-4, and 4-7, which exhibit good properties, the metal content of the upper-surface-adjacent portion 223d is ¼ or less that of the lower-electrode-adjacent portion 223c. Particularly, in the piezoelectric actuators of Nos. 4-2, 4-3, and 4-4, the metal content of the upper-surface-adjacent portion 223d is almost zero.

Thus, in the present Example, when the amount of the metal dispersed in the lower-electrode-adjacent portion 223c is regulated to be greater than that of the metal dispersed in the upper-surface-adjacent portion 223d, the dielectric constant of the lower-electrode-adjacent portion 223c becomes higher than that of the upper-surface-adjacent portion 223d. Therefore, electric field concentration occurs in the upper-surface-adjacent portion 223d. This electric field concentration increases the amount of deformation of the upper-surface-adjacent portion 223d through the transverse piezoelectric effect, and attains larger bending displacement.

In contrast to these piezoelectric actuators, in the piezoelectric actuators of Nos. 4-5 and 4-6, in which the silver content of the lower-electrode-adjacent portion 223c exceeds 20%, good bending displacement fails to be attained. Meanwhile, in the piezoelectric actuator of No. 4-8, in which the silver content of the upper-surface-adjacent portion 223d exceeds 5%, proper electron emission fails to be attained.

Modifications

The aforementioned embodiment and Examples are merely typical embodiment and Examples of the present invention which have been considered best by the present applicant at the time when the present application has been filed. Thus, the present invention is not limited to the aforementioned embodiment and Examples. Therefore, it should be understood that various modifications of the aforementioned embodiment and Examples may be made so long as the essentials of the present invention are not changed.

Several typical modifications will next be described. In the below-described modifications, members having configuration and function similar to those described in the aforementioned embodiment and Examples are denoted by the same reference numerals as those employed in the embodiment and Examples. Description of the embodiment and Examples can be applied to description of such members, so long as these descriptions do not technically contradict each other.

Needless to say, modifications of the aforementioned embodiment and Examples are not limited to the below-described ones. Meanwhile, a plurality of modifications may be appropriately employed in combination, so long as these modifications do not technically contradict one another.

(i) Application of the present invention is not limited to electron emitters and piezoelectric actuators as described above in the embodiment and Examples. The present invention can be suitably applied to, for example, ceramic filters (e.g., an SAW filter), piezoelectric buzzers, piezoelectric vibratory gyroscopes, piezoelectric microphones, various piezoelectric sensors, and Rosen-type piezoelectric transformers.

(ii) Application of the electron emitter 120 according to the aforementioned embodiment and Examples is not limited to FEDs. The configuration of the electron emitter 120 is not limited to that described in the aforementioned embodiment and Examples.

For example, in the electron emitter 120 according to the aforementioned embodiment, the lower electrode 122 is formed on the lower surface 123b of the emitter layer 123, and the upper electrode 124 is formed on the upper surface 123a of the emitter layer 123. However, this configuration may be modified such that an electrode other than the upper electrode 124 is formed on the upper surface 123a of the emitter layer 123. In this case, the aforementioned drive voltage is applied between the upper electrode 124 and the electrode other than the upper electrode 124.

The substrate 121 may be formed of a metal in place of a glass or ceramic material.

(iii) The material of the dielectric layer 13 (the emitter layer 123 or piezoelectric/electrostrictive layer 223) or the form of the aforementioned metal contained in the layer may be appropriately modified. For example, the metal may be contained in the form of oxide.

The state of distribution of the aforementioned metal may be appropriately modified within the scope of the present invention. For example, each of the lower-electrode-adjacent portion 13c (the lower-electrode-adjacent portion 123c or 223c) and the upper-surface-adjacent portion 13d (the upper-surface-adjacent portion 123d or 223d) may be formed so as to have a thickness about ½ that of the dielectric layer 13 (the emitter layer 123 or piezoelectric/electrostrictive layer 223).

Alternatively, the lower-electrode-adjacent portion 13c (the lower-electrode-adjacent portion 123c or 223c) and/or the upper-surface-adjacent portion 13d (the upper-surface-adjacent portion 123d or 223d) may be formed so as to have a very small thickness; i.e., a thickness about ⅒ that of the dielectric layer 13 (the emitter layer 123 or piezoelectric/electrostrictive layer 223).

(iv) Operational and functional elements constituting means for achieving the objects of the present invention encompass, in addition to specific structures disclosed in the aforementioned embodiment, Examples, and modifications, any structure capable of attaining the operation and function of the present invention.

What is claimed:

1. A dielectric device comprising:
   a substrate;
   a base electrode which is formed of a conductor film and is provided on the substrate; and
   a dielectric layer formed on the base electrode, said dielectric layer comprising free metal,
   wherein the dielectric layer is formed so that the free metal concentration of a first portion of the dielectric layer located between the center of the dielectric layer in a thickness direction thereof and the base electrode is higher than that of a second portion of the dielectric layer located between the center of the dielectric layer and an upper surface thereof, and wherein the metal concentration by volume of the first portion is 2% to 20%, and the metal concentration by volume of the second portion is 5% or less.

2. A dielectric device according to claim 1, wherein the dielectric layer is formed so that the porosity of the dielectric layer falls within a range of 2% to 20%.

* * * * *